US008527802B1

(12) United States Patent  
Tran et al.

(10) Patent No.: US 8,527,802 B1
(45) Date of Patent: Sep. 3, 2013

(54) MEMORY DEVICE DATA LATENCY CIRCUITS AND METHODS

(71) Applicant: Cypress Semiconductor Corporation, San Jose, CA (US)

(72) Inventors: Thinh Tran, Palo Alto, CA (US); Joseph Tzou, Mountain View, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/717,637

(22) Filed: Dec. 17, 2012

Related U.S. Application Data

(60) Provisional application No. 61/693,166, filed on Aug. 24, 2012.

(51) Int. Cl.
| | | |
|---|---|---|
| *G06F 13/42* | (2006.01) | |
| *G06F 12/00* | (2006.01) | |
| *G06F 13/00* | (2006.01) | |
| *H04L 7/00* | (2006.01) | |

(52) U.S. Cl.
USPC ............... 713/400; 711/1; 711/100; 711/219

(58) Field of Classification Search
None
See application file for complete search history.

(56) References Cited

U.S. PATENT DOCUMENTS

| 5,829,026 | A  | * | 10/1998 | Leung et al. ................. 711/122 |
|---|---|---|---|---|
| 6,141,274 | A  | * | 10/2000 | Eto et al. ...................... 365/203 |
| 6,539,454 | B2 | * | 3/2003  | Mes ............................... 711/105 |
| 6,954,870 | B2 | * | 10/2005 | Chen et al. .................... 713/401 |
| 7,245,552 | B2 | * | 7/2007  | Freebern .................. 365/189.14 |
| 7,246,199 | B2 | * | 7/2007  | Smith et al. ................... 711/112 |
| 7,434,023 | B2 | * | 10/2008 | Nodomi et al. ............... 711/202 |
| 2011/0161581 | A1 | * | 6/2011 | Shin ............................. 711/109 |
| 2012/0008452 | A1 | * | 1/2012 | Lee ......................... 365/230.08 |
| 2012/0327723 | A1 | * | 12/2012 | Taruishi et al. .......... 365/189.05 |

OTHER PUBLICATIONS

Electrosofts.com, "Implementing a FIFO using Verilog", 2005-2007, retrieved from the World Wide Web at http://electrosofts.com/verilog/fifo.html.*

* cited by examiner

*Primary Examiner* — Ji H Bae

(57) ABSTRACT

A memory device can include a data path that includes a first-in-first-out circuit (FIFO) to transfer data according to a latency between at least one memory cell array and signal connections of the memory device, the latency corresponding to a number of cycles of a periodic clock; and a self-timed section configured to transfer data independent of the clock. In addition or alternatively, a memory device can include at least one memory cell array; and a FIFO configured to transfer data between at least one memory cell array and other portions of the memory device according to a periodic clock signal, FIFO introducing a latency into the data according to a control signal generated in response to an access command. Methods corresponding to the above devices and operations are also disclosed.

18 Claims, 19 Drawing Sheets

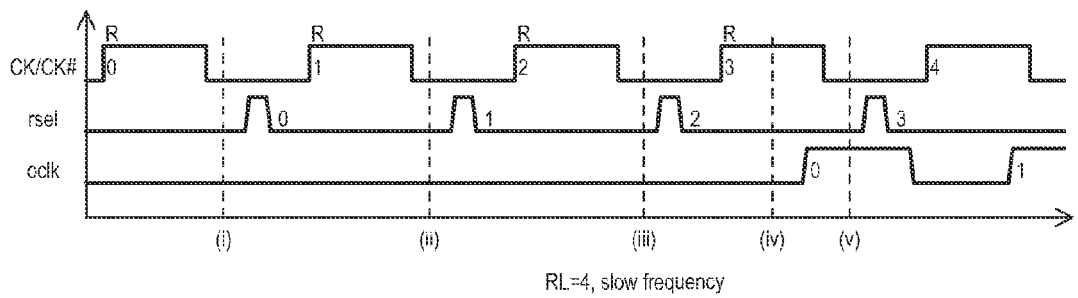
FIG. 3C
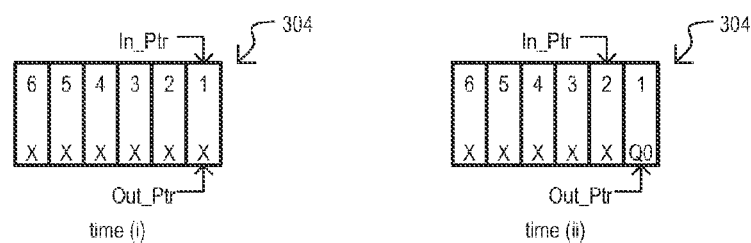
FIG. 3D-0    FIG. 3D-1
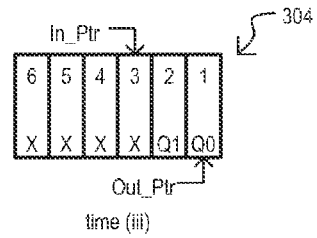 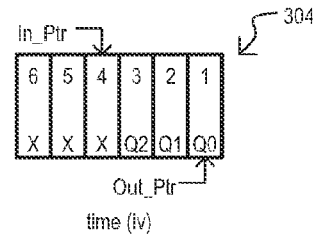
FIG. 3D-2    FIG. 3D-3
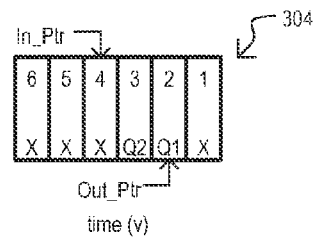
FIG. 3D-4 time (1)

time (2)

time (3)

time (4)

time (5)

time (6)

time (7)

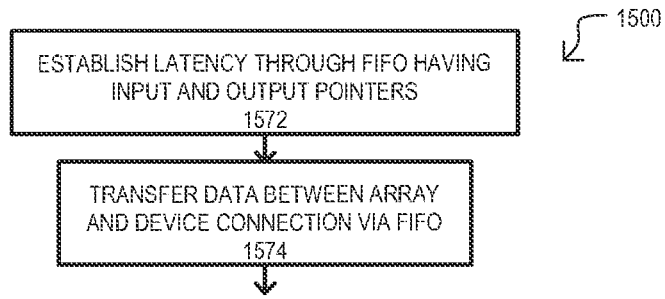
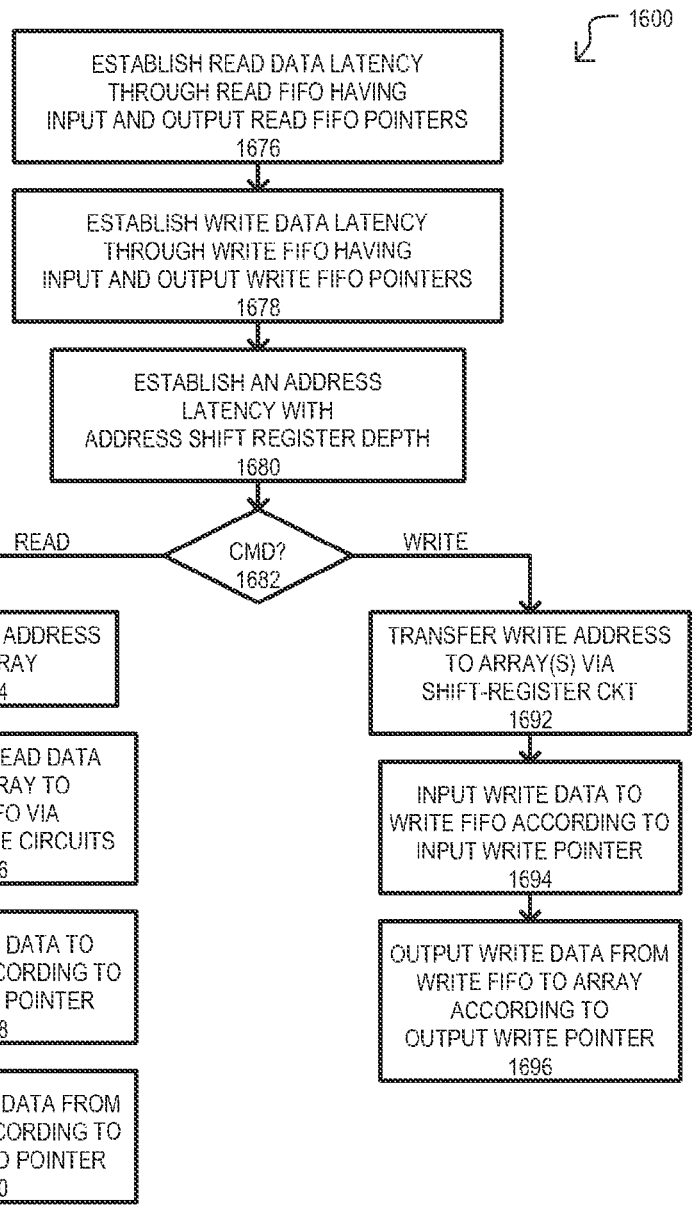
FIG. 15
FIG. 16

MEMORY DEVICE DATA LATENCY CIRCUITS AND METHODS

This application claims the benefit of U.S. provisional patent application Ser. No. 61/693,166 filed on Aug. 24, 2012, the contents of which are incorporated by reference herein.

TECHNICAL FIELD

The present disclosure relates generally to memory devices, and more particularly to circuits and methods for establishing data latencies for accesses to a memory device.

BACKGROUND

Synchronous memory devices can operate with data access latencies. A read latency can be the number of clock cycles between the application of a read instruction (and/or address) and the output of read data on the outputs of the memory device. Similarly, a write latency can be the number of clock cycles between the application of a write instruction (and/or address) and the application of write data at data inputs. With respect to write operations, there can also be a write data latency between the application of a write instruction/address (or write data), and the actual writing of the data into the memory array.

FIG. 17 shows a conventional synchronous memory device read path 1701. An address (ADD) can be applied to a memory array 1703 to access read data (data). Read data (data) is clocked through a number of clocked latches 1705-1, -2, -3 to an output register 1707. Each of the clocked latches (1705-1, -2, -3) can be controlled with a corresponding clock signal ck-lat1/2/3. To accommodate different latencies, different control circuits are designed to generate the clock signals (ck-lat1/2/3). The design of control circuits can be complicated and require simulation to ensure robust operation. While such a conventional approach can accommodate relatively shorter latencies (e.g., 1.0, 1.5, 2.0 and 2.5 clock cycles), such circuits may not accommodate larger latencies (e.g., 4 or more cycles).

FIG. 18 shows a conventional synchronous memory device write path 1801. Write data (D) can be applied to a series of latches 1805-0/1. A multiplexer (MUX) 1807-0 can selectively output write data (D) from either latch 1805-0/1 to vary a latency of data applied to a memory array. Variations in latency of an applied address (ADD) can be accomplished in the same manner, selecting address values from either latch 1805-2/3 with a MUX 1807-1.

FIG. 19 shows a conventional memory device clocked pipeline read path 1901. The read path 1901 can include memory array 1903, read data bus lines 1913, an error correction section 1909, a read data first-in-first-out circuit (FIFO) 1911, and timing registers 1907-1 to -3. Data transfers to each section occur by operation of a clock signal (clk) applied to the timing registers (1907-1 to -3). Read path 1901 is divided into four sections 1913-1 to -4. Each section (1913-1 to -4) should have equal delay. However, meeting such a delay requirement can be difficult to implement. Further, once such a clocked pipeline read path 1901 has been designed, it can be difficult to change between read latencies (e.g., from 4 cycles to 5 cycles) without incurring a speed penalty in device operations.

BRIEF DESCRIPTION OF THE DRAWINGS

FIG. 3C is a timing diagram showing read operations, according to an embodiment, at a relatively slow frequency. FIGS. 3D-0 to 3D-4 are block diagrams of a read FIFO showing the read operations of FIG. 3C.

FIGS. 3F-0 to 3F-3 are block diagrams of a read FIFO showing the read operations of FIG. 3E.

FIGS. 3H-0 to 3H-6 are block diagrams of a read FIFO showing read operations of FIG. 3G.

FIGS. 3J-0 to 3J-6 are block diagrams of a read FIFO showing the read operations of FIG. 3I.

FIGS. 3K-0 to 3K-3 are timing diagrams showing various read operations according to embodiments.

FIG. 5 is a block schematic diagram of one particular read control circuit that can be included in embodiments.

FIGS. 8B-0 to 8B-8 are block diagrams of a write FIFO showing write operations of FIG. 8A.

FIGS. 9B-0 to 9B-7 are block diagrams of an address shift-register (S-R) circuit showing write operations of FIG. 9A.

FIG. 15 is a flow diagram of a method according to an embodiment.

FIG. 16 is a flow diagram of a method according to another embodiment.

DETAILED DESCRIPTION

Figure 1:
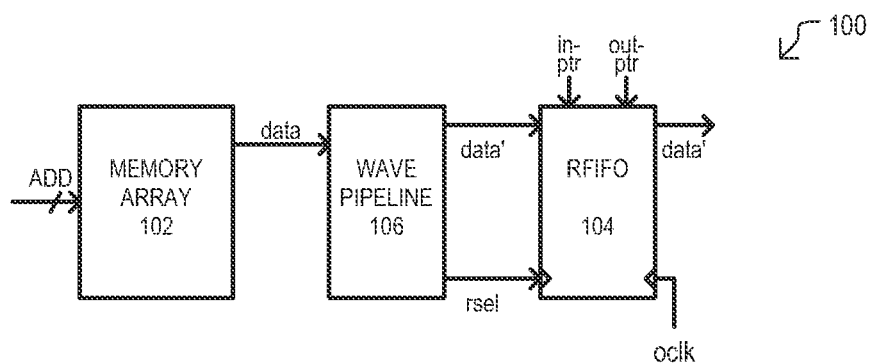
FIG. 1 is a block schematic diagram of a memory device that can establish a read latency, according to one embodiment.

Various embodiments will now be described that include memory devices and methods for supporting multiple latency options. Embodiments can include latency circuits with first-in-first-out circuits (FIFOs) that can establish latencies by establishing when data are clocked out of and/or into the FIFOs. In particular embodiments, the same general latency circuit can be incorporated into different memory devices/configurations to establish any of a number of different latency options, and/or a latency circuit can be programmable to provide different latency options.

In embodiments below, like sections are referred to by the same reference character, but with the leading digit(s) corresponding to the figure number.

Referring now to FIG. 1, a memory device according to one embodiment is shown in a block schematic diagram and designated by the general reference character 100. A memory device 100 can include a memory array section 102, a read first-in-first-out circuit (FIFO) 104, and optionally, a wave pipeline section 106. A memory array section 102 can include one or more memory cell arrays, corresponding decoder circuits, and data sensing circuits, which can enable read data (data) to be accessed in response to an applied address (ADD). A memory array section 102 can include any suitable memory cell type or architectures, including but not limited to: static random access memory (SRAM) type cells, dynamic RAM (DRAM) type cells, pseudo-SRAM type architectures, and/or any of various non-volatile type memory cells.

A read FIFO 104 can output read data received from a memory array 102 in a first-in-first-out fashion, according to an input pointer (in ptr), output pointer (out ptr), a select signal (rsel), and FIFO output signal (oclk). In particular, received read data is stored at a FIFO address location indicated by an input pointer, and output from a FIFO address location indicated by an output pointer, with both pointers getting incremented by as data is input to and output from the FIFO 104. A latency introduced by read FIFO 104 can be established by setting a delay between the application of a read command and the activation of oclk. In very particular embodiments, and as will be described in more detail below, a latency can be established by pointers of a read control FIFO (not shown in FIG. 1), which can include read control input and output pointers to establish a read latency. This is in sharp contrast to conventional approaches, which can require a re-design of control circuits to establish different latency options.

Figure 19:
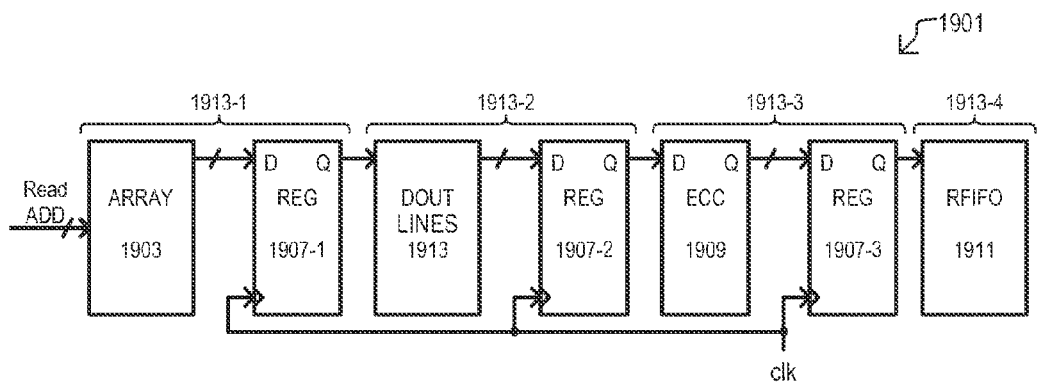
FIG. 19 is a block schematic diagram of a conventional memory device clocked read pipeline.

In some embodiments, a wave pipeline section 106 can exist between memory array section 102 and read FIFO 104. A wave pipeline section 106 can include one or more circuit blocks through which read data propagates and/or is operated on. In contrast to a clocked pipeline, like that of FIG. 19, block(s) of a wave pipeline section 106 do not transfer data in response to a periodic clock signal. Instead, the operation of each block within wave pipeline section 106 can be triggered by the end of operations in a previous block. That is, block(s) of wave pipeline section 106 can operate in a self-timed or asynchronous fashion, being independent of periodic control signals that can control other timing in the memory device.

Accordingly, an operation of a wave pipeline section 106 can be faster than a clocked pipeline having a same number of circuit blocks.

A wave pipeline section 106 can include various circuits, including but not limited to: error detection and/or correction circuits, data encryption or decryption circuits, error code generation circuits, or data scrambling or de-scrambling circuits.

Referring still to FIG. 1, in a read operation, a read address (ADD) can be applied to memory array section 102. In a particular embodiment, the read address (ADD) and corresponding read command can be phase aligned with a timing clock for the memory device 100. Read data (data) accessed by the read address (ADD) can be input to wave pipeline section 106, which can operate on, or propagate such read data in an asynchronous fashion (e.g., not according to the memory device timing clock). When operations through wave pipeline section 106 are complete, read data (data') can be transferred to read FIFO 104 according to a select signal (rsel). It is noted that signal rsel can be asynchronous, and that read data (data') can be the same as, or different from, read data (data) originally output from memory array 102. Read FIFO 104 can store read data (data') at a location indicated by "in-ptr", and output data from a location indicated by "out-ptr" according to a timing established by signal oclk. Further, values "in-ptr" and "out-ptr" can be incremented according to signals which input data to, and output data from, the FIFO 104. In very particular embodiments, in-ptr can be incremented in response to rsel, while out-ptr can be incremented in response to oclk.

Figure 2:
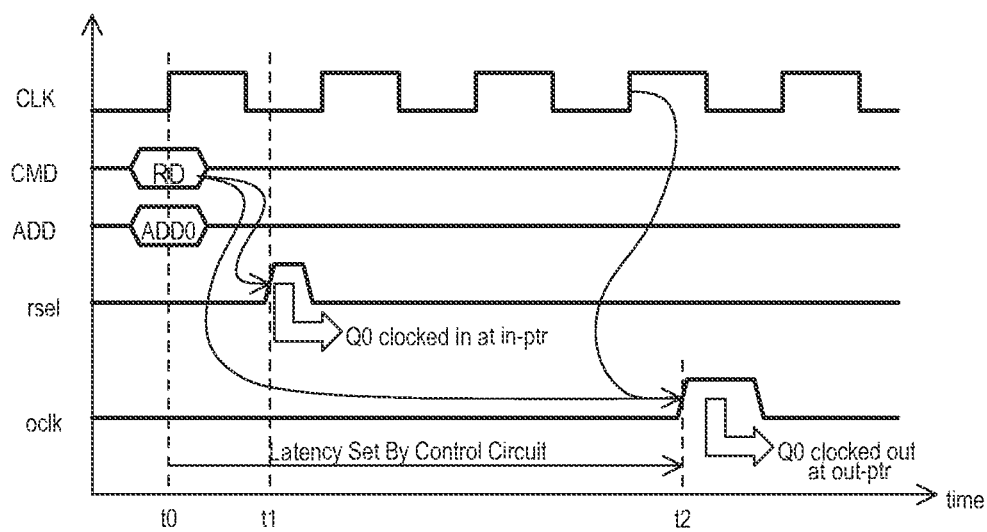
FIG. 2 is a timing diagram showing read operations for a memory device like that of FIG. 1.

FIG. 2 is a timing diagram showing an operation of a memory device, like that FIG. 1, according to an embodiment. FIG. 2 shows a number of waveforms: CLK is a periodic system clock that can control timing of accesses to the memory device; CMD can be command inputs received by the memory device; ADD can be address data received by the memory device; rsel can be a signal that transfers data into a read FIFO; and oclk can be a signal that transfers data from the read FIFO.

At about time t0, a read command and read address can be applied to the memory device having a predetermined phase relationship with system clock CLK. In the embodiment shown, such values can be applied on a rising edge of CLK. Accordingly, CMD shows a read command (RD) and an address (ADD0) being received on the rising edge of CLK.

At about time t1, in response to the read command (RD), rsel can be activated (go high in this example). In the embodiment shown, rsel is an asynchronous signal, having a timing that is independent of signal CLK. In some embodiments, rsel can be output from a one or more self-timed circuits through which read data can flow (and/or be operated on). In response to the active rsel signal, data corresponding to address ADD0 (Q0) can be input (i.e., "clocked-in") to the FIFO at an input pointer location (in-ptr).

At about time t2, also in response to the read command (RD), oclk can be activated (go high in this example). In the embodiment shown, oclk is a synchronous signal, being activated with a predetermined phase relationship with respect to signal CLK. The delay between receipt of the read command (RD) and activation of oclk can establish a latency of read data through the FIFO. In response to the active oclk signal, data corresponding to address ADD0 (Q0) can be output (i.e., "clocked-out") from the FIFO at the output pointer location (out-ptr).

It is understood that a read FIFO latency can be but one part of an overall read latency. That is, a memory device can include circuits prior to a read FIFO input, or after a read FIFO output, that can introduce additional latency into a read data path.

Figure 3A:
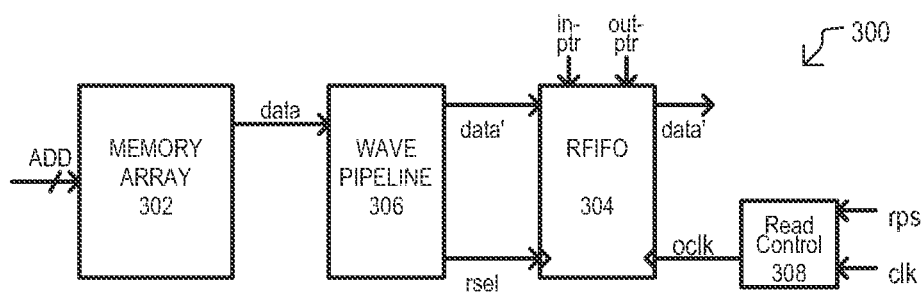
FIG. 3A is a block schematic diagram of a memory device that can establish a read latency, according to another embodiment.

Referring now to FIG. 3A, a memory device 300 according to another embodiment is shown in a block schematic diagram. A memory device 300 can include sections like those of FIG. 1, and such sections can be the same or equivalents to those of FIG. 1.

Unlike FIG. 1, FIG. 3A also shows a read control circuit 308. A read control circuit 308 can receive a read command signal (rps) and a periodic timing clock (clk), and in response, generate a FIFO output signal (oclk). A read pulse signal (rps) can be activated in response to receiving a read command. Signal clk can be synchronous to a system clock of the memory device. In operation, a read control circuit 308 can activate the oclk signal a predetermined number of clk cycles following the activation of rps. Such a delay between receipt of rps and activation of oclk can establish a latency through FIFO 304, and hence a read latency of memory device 300.

Figure 3B:
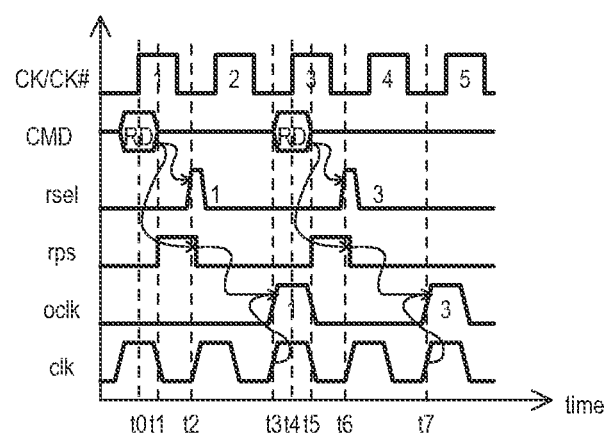
FIG. 3B is a timing diagram showing read operations for a memory device like that of FIG. 3A.

FIG. 3B is a timing diagram showing an operation of a memory device, like that FIG. 3A, according to an embodiment. FIG. 3B shows a number of waveforms: CK/CK# is a periodic system clock (or its complement) that can control timing of accesses to the memory device; CMD can be command inputs received by the memory device; rsel can be a signal that transfers data into a read FIFO; rps can be a signal indicating a read operation; oclk can be a signal that transfers data from the read FIFO; and clk can be a signal synchronous (but phase shifted) with respect to CK/CK#. FIG. 3B shows operations with a smaller latency than that in FIG. 2.

At time t0, a read command can be applied to the memory device.

At time t1, rps can be activated (go high in this example) in response to the read command.

At time t2, rsel can be activated (go high in this example) in response to the read command, loading a read data value into a FIFO at an input pointer location. The input pointer can also be incremented in response to rsel.

At time t3, oclk can be activated (go high in this example) a predetermined delay after the read command, and in synchronism with clk. Such action can output the data from the FIFO at an output pointer location. The output pointer can also be incremented in response to oclk. A signal oclk can be generated by a read control circuit (e.g., 308) as described above.

At times t4, a second read command can be received. At times t5-t7, actions like those of times t1-t3 can take place. The active rsel signal at time t6 can advance the input pointer further, and the active oclk signal at time t7 can advance the output pointer further.

In this way, data from a memory array can propagate through a FIFO. Read data values can be input at an input pointer locations and output from an output pointer location. Initial input and output pointer values can be the same. Input and output pointer values can advance in response to read commands. Signals which clock data into (rsel) and out of (oclk) the FIFO are activated at different times.

Very particular examples of read operations for an embodiment like that of FIG. 3A will now be described with reference to FIGS. 3C to 3K-3.

FIG. 3C is a timing diagram showing read operations according to embodiments that occur at a relatively slow frequency, and with a read latency of 4 (RL=4). FIG. 3C shows a number of waveforms: CK/CK# is a periodic system clock (or its complement); rsel can be a signal that transfers data into a read FIFO and advances an input pointer (In_Ptr); and oclk can be a signal that transfers data from the read FIFO and advances an output pointer (Out_Ptr). The "R" above rising edges of waveform CK/CK# shows the application of read commands.

FIGS. 3D-0 to 3D-4 are block diagrams showing one example of a read FIFO 304 at various times during the read operations of FIG. 3C. In the figures shown, read FIFO 304 has six storage locations (labeled 1-6). Input and output pointer locations are shown "In_Ptr" and "Out_Ptr" and corresponding arrows.

Figure 3E:
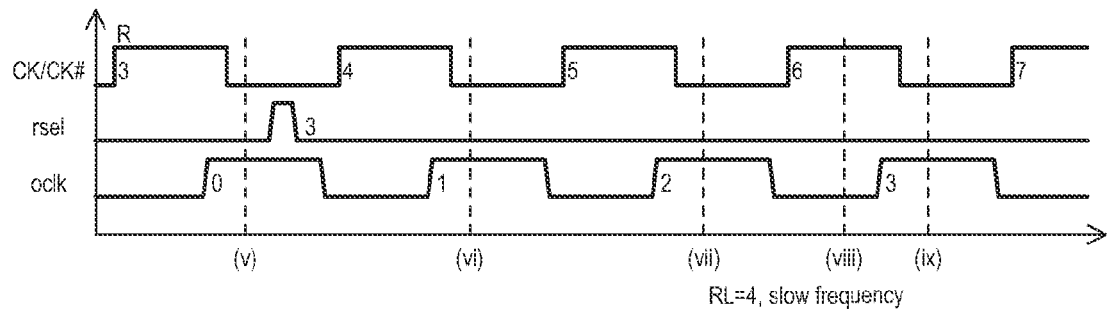
FIG. 3E is a timing diagram showing additional read operations according to an embodiment that follow those of FIG. 3C.
Figures 0, 3F:
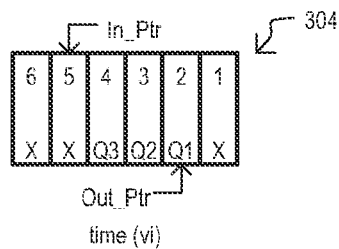
Figures 1, 3F:
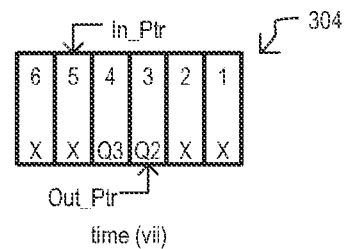
Figures 2, 3F:
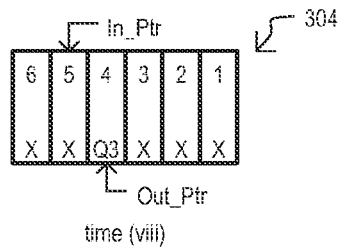

FIG. 3D-0 shows a read FIFO 304 at time (i). In_Ptr and Out_Ptr are at initial locations, both pointing to location 1. All storage locations store invalid values, indicated by "X".

FIG. 3D-1 shows a read FIFO 304 at time (ii). In response to a previous active rsel signal (resulting from a read command), a read data value Q0 can be stored at location 1. Further, In_Ptr can advance to position 2.

FIG. 3D-2 shows a read FIFO 304 at time (iii). In response to another active rsel signal (resulting from a second read command), a read data value Q1 can be stored at location 2. Further, In_Ptr can advance to position 3.

Figures 3, 3F:
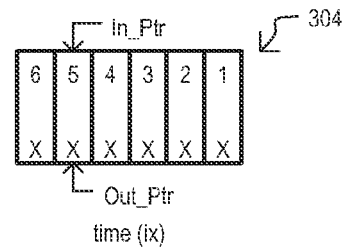

FIG. 3D-3 shows a read FIFO 304 at time (iv). In response to another active rsel signal (resulting from a third read command), a read data value Q2 can be stored at location 3. Further, In_Ptr can advance to position 4. Up until this time, signal oclk has not been activated, thus output pointer Out_Ptr remains at its initial position.

Figure 3G:
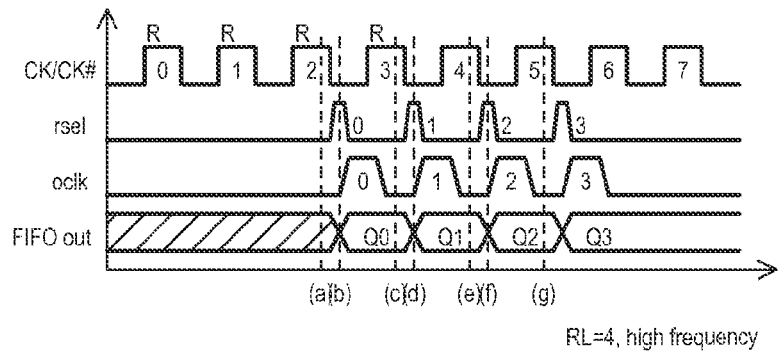
FIG. 3G is a timing diagram showing read operations according to an embodiment at a relatively fast frequency.
Figures 0, 1, 2, 3H:
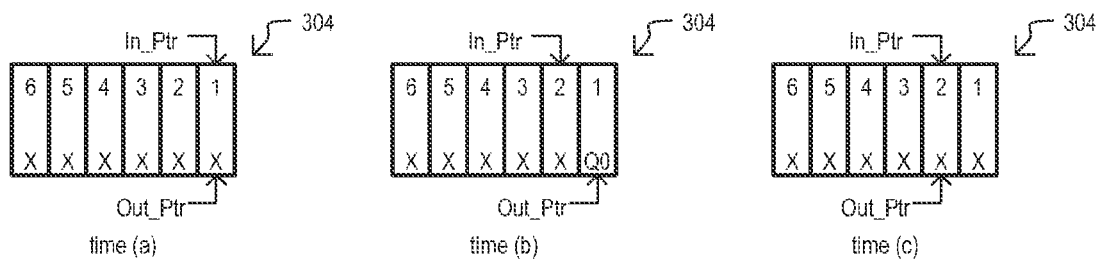
Figures 3, 3H, 4, 5:
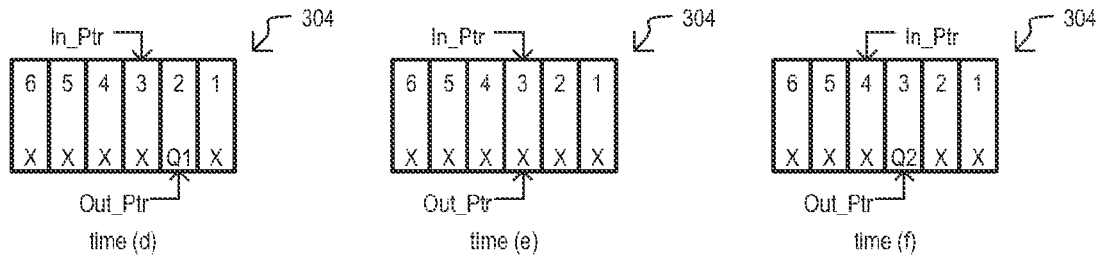

FIG. 3D-4 shows a read FIFO 304 at time (v). In response to the activation of signal oclk (in response to the first read command), read data value Q0 can be output from the FIFO 304 (rendering location 1 invalid). Further, Out_Ptr can advance to position 2.

FIG. 3E is a timing diagram showing continuing operations following those of FIG. 3C. FIGS. 3F-0 to 3F-3 are block diagrams showing one example of a read FIFO 304 at various times during the read operations of FIG. 3E.

FIG. 3F-0 shows a read FIFO 304 at time (vi). In response to a previous active rsel signal (resulting from a fourth read command, shown at cycle 3, in FIG. 3C), a read data value Q3 can be stored at location 4. Further, In_Ptr can advance to position 5.

FIG. 3F-1 shows a read FIFO 304 at time (vii). In response to the activation of signal oclk (in response to the second read command), read data value Q1 can be output from the FIFO 304 (rendering location 2 invalid). Further, Out_Ptr can advance to position 3.

FIG. 3F-2 shows a read FIFO 304 at time (viii). In response to the activation of signal oclk (in response to the third read command), read data value Q2 can be output from the FIFO 304 (rendering location 3 invalid). Further, Out_Ptr can advance to position 4.

FIG. 3F-3 shows a read FIFO 304 at time (ix). In response to the activation of signal oclk (in response to the fourth read command), read data value Q2 can be output from the FIFO 304 (rendering location 4 invalid). Further, Out_Ptr can advance to position 5.

In this way, at lower operating frequencies, read data values can accumulate in the read FIFO to be clocked out after a set latency.

FIG. 3G is a timing diagram showing read operations according to embodiments that occur at a relatively fast frequency, and with a read latency of 4 (RL=4). FIG. 3G shows waveforms like those of FIG. 3E, but further includes FIFO OUT, which shows when data are output from the read FIFO. FIGS. 3H-0 to 3H-6 are block diagrams showing one example of a read FIFO 304 at various times during the read operations of FIG. 3G.

FIG. 3H-0 shows a read FIFO 304 at time (a). In_Ptr and Out_Ptr are at initial locations, both pointing to location 1. All storage locations store invalid values, indicated by "X".

FIG. 3H-1 shows a read FIFO 304 at time (b). In response to an active rsel signal (resulting from a read command), a read data value Q0 can be stored at location 1. Further, In_Ptr can advance to position 2.

FIG. 3H-2 shows a read FIFO 304 at time (c). In response to the activation of signal oclk (corresponding to the first read command), read data value Q0 can be output from the FIFO 304 (rendering location 1 invalid). Further, Out_Ptr can advance to position 2.

FIG. 3H-3 shows a read FIFO 304 at time (d). In response to an active rsel signal (resulting from a second read command), a read data value Q1 can be stored at location 2. Further, In_Ptr can advance to position 3.

FIG. 3H-4 shows a read FIFO 304 at time (e). In response to the activation of signal oclk (corresponding to the second read command), read data value Q1 can be output from the FIFO 304 (rendering location 2 invalid). Further, Out_Ptr can advance to position 3.

FIG. 3H-5 shows a read FIFO 304 at time (f). In response to an active rsel signal (resulting from a third read command), a read data value Q2 can be stored at location 3. Further, In_Ptr can advance to position 4.

FIG. 3H-6 shows a read FIFO 304 at time (g). In response to the activation of signal oclk (corresponding to the third read command), read data value Q2 can be output from the FIFO 304 (rendering location 3 invalid). Further, Out_Ptr can advance to position 4.

Figures 3, 3H, 4, 5, 6:
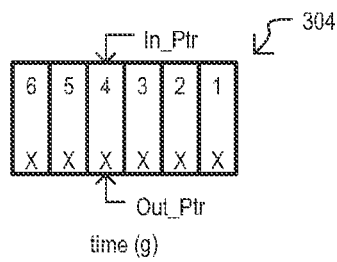
Figure 3I:
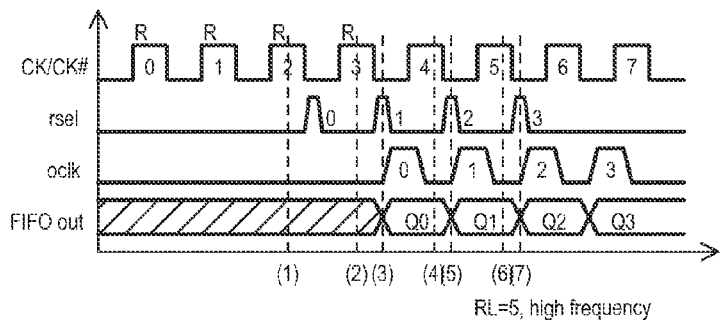
FIG. 3I is a timing diagram showing read operations according to an embodiment at a relatively fast frequency, but with a different latency than that of FIG. 3G.

FIG. 3I is a timing diagram showing additional "fast" read operations according to embodiments, like those of FIG. 3G, but with a read latency of 5 (RL=5). FIGS. 3J-0 to 3J-6 are block diagrams showing one example of a read FIFO 304 at various times during the read operations of FIG. 3I.

Figures 0, 3J:
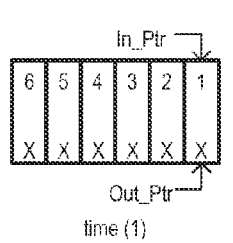
Figures 1, 3J:
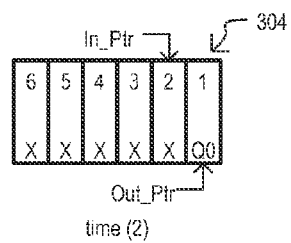
Figures 2, 3J:
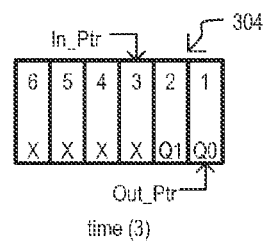
Figures 3, 3J:
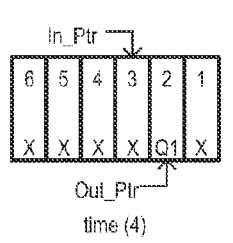
Figures 3, 3J, 4:
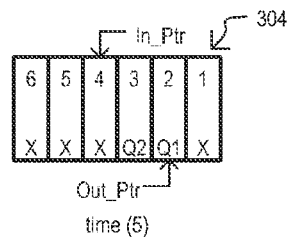
Figures 3, 3J, 4, 5:
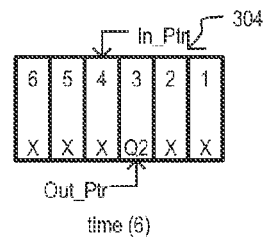
Figures 3, 3J, 4, 5, 6:
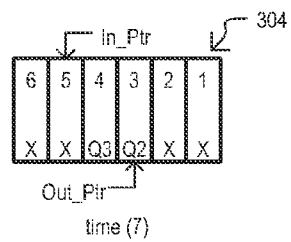

FIG. 3J-0 shows a read FIFO 304 at time (1). In_Ptr and Out_Ptr are at initial locations, both pointing to location 1. All storage locations store invalid values, indicated by "X".

FIG. 3J-1 shows a read FIFO 304 at time (2). In response to an active rsel signal (resulting from a read command), a read data value Q0 can be stored at location 1, and In_Ptr advances to position 2.

FIG. 3J-2 shows a read FIFO 304 at time (3). In response to an active rsel signal (resulting from a second command), a read data value Q1 can be stored at location 2, and In_Ptr advances to position 3.

FIG. 3J-3 shows a read FIFO 304 at time (4). In response to the activation of signal oclk (corresponding to the first read command), read data value Q0 can be output from the FIFO 304 (rendering location 1 invalid), and Out_Ptr can advance to position 2.

FIG. 3J-4 shows a read FIFO 304 at time (5). In response to an active rsel signal (resulting from a third read command), a read data value Q2 can be stored at location 3, and In_Ptr can advance to position 4.

FIG. 3J-5 shows a read FIFO 304 at time (6). In response to the activation of signal oclk (corresponding to the second read command), read data value Q1 can be output from the FIFO 304 (rendering location 2 invalid), and Out_Ptr can advance to position 3.

FIG. 3J-6 shows a read FIFO 304 at time (7). In response to an active rsel signal (resulting from a fourth read command), a read data value Q3 can be stored at location 4, and In_Ptr can advance to position 5.

Figures 0, 3K:
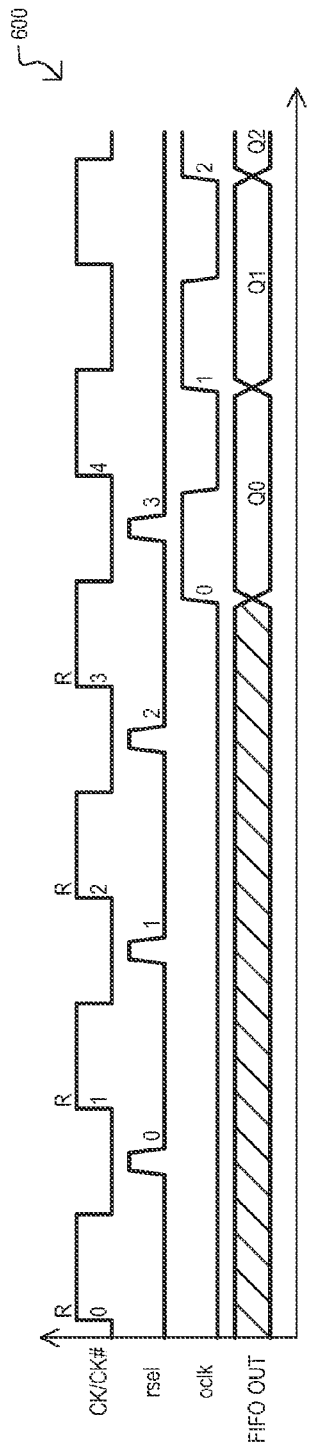
Figures 1, 3K:
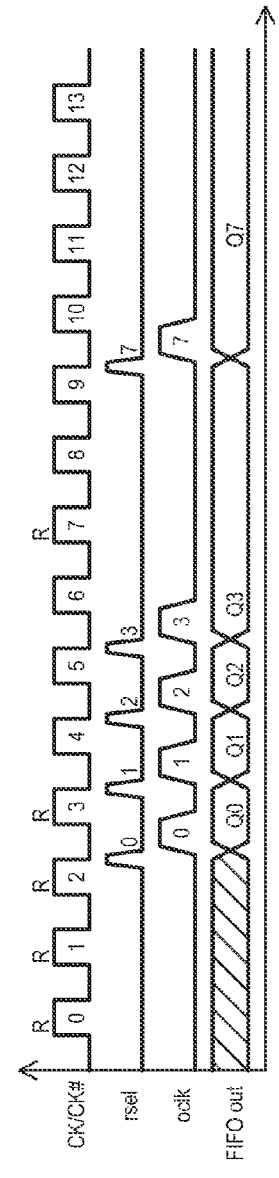
Figures 2, 3K:
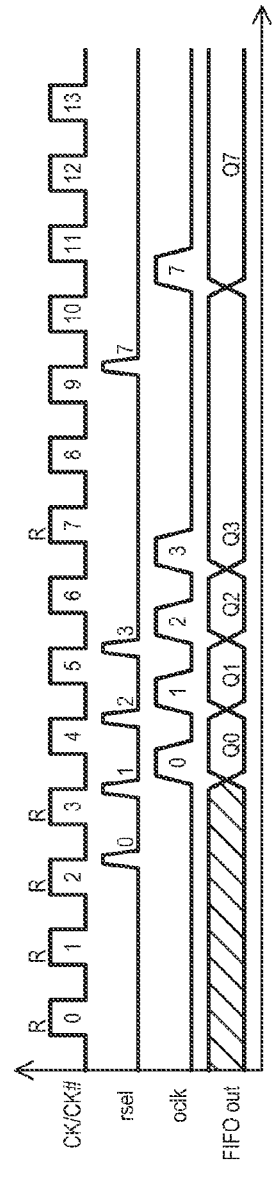
Figures 3, 3K:
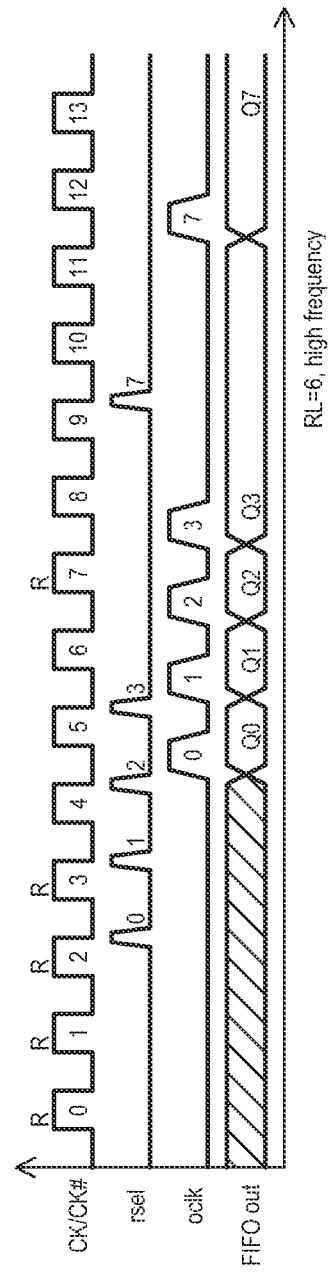

FIGS. 3K-0 to 3K-3 are timing diagrams that summarize read FIFO operations according to embodiments described above, and demonstrate how such read operations can accommodate a wide range of operating frequencies.

FIG. 3K-0 shows read operations like those of FIG. 3C, but with the FIFO OUT waveform. Read operations occur at a relatively slow frequency, and with a read latency of four. As understood from FIGS. 3C to 3F-3, at lower frequencies, a read FIFO can accumulate read data values as read commands are received over a read latency period. Such read values can then be output with the desired latency with a synchronous FIFO output signal (e.g., oclk).

FIG. 3K-1 shows read operations like those of FIG. 3G, but with an additional read operation occurring on the seventh clock cycle. FIG. 3K-2 shows read operations like those of FIG. 3I, but with an additional read operation occurring on the seventh clock cycle. FIG. 3K-3 shows read operations like those of FIG. 3I, but with an additional read operation occurring on the seventh clock cycle, and a read latency of six (RL=6).

As understood from FIGS. 3G to 3J-6, at higher frequencies, a read FIFO can clock out read data values shortly after they are clocked in, with the output pointer Out_Ptr being incremented shortly after the input pointer In_Ptr From the embodiments above, it is understood that the clocking of read data into a read FIFO (e.g., the rsel signal) can be entirely independent of read latency and/or clock frequency. Thus, read data can be captured in a read FIFO in a rapid fashion, regardless of the read latency established for the device. In contrast, the clocking of data out of the read FIFO (e.g., the oclk signal) can depend strongly on the established read latency and clock frequency.

Figure 4A:
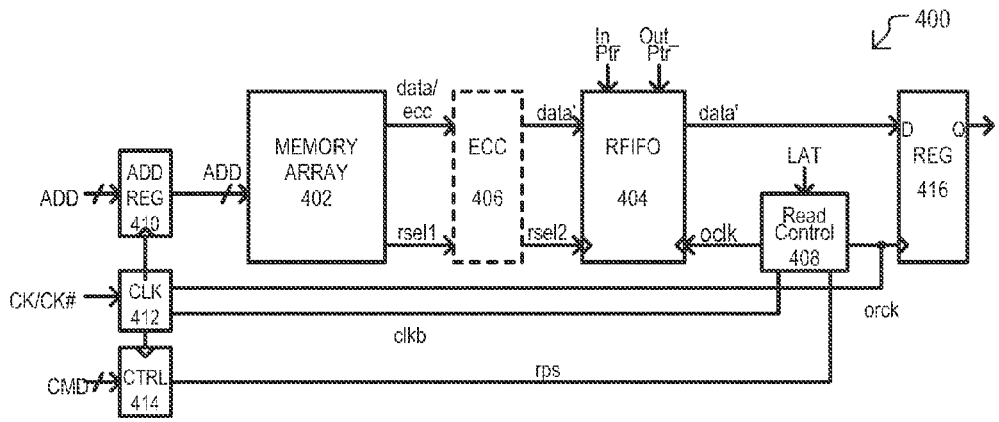
FIG. 4A is a block schematic diagram of a memory device that can establish a read latency, according to another embodiment.

Referring now to FIG. 4A, a memory device according to another embodiment is shown in a block schematic diagram and designated by the general reference character 400. A memory device 400 can include a memory array section 402, a read FIFO 404, an output register 416, an address register 410, a clock circuit 412, a read control circuit 408, and a control circuit 414. Optionally, a memory device 400 can also include an error correction and/or detection (ECC) section 406.

A memory array section 402 can include features like those described for memory array 102 of FIG. 1. In FIG. 4A, an address value (ADD) can be input to memory array 402 via address register 410. Read data can be output from memory array 402 along with the activation of a select signal rsel1. Optionally, read data can be output with error correction and/or detection data (data/ecc) with the activation of select signal rsel2.

If included, an ECC section 406 can perform error detection or correction on read data in a wave pipeline fashion. That is, error detection/correction operations can occur in an asynchronous fashion, and once such read data has been processed, it can be output to read FIFO 404 along with the activation of a select signal rsel2.

A read FIFO 404 take the form of any of those described herein, or an equivalent. Read data (data) can be stored at a location indicated by an input pointer (In_Ptr), and data can be read from a location indicated by an output pointer (Out_Ptr). Read data (data) can be stored in response to a select signal rsel2 (or rsel1, if ECC section 406 is not included), which can also increment In_Ptr. Data can be output from read FIFO 404 in response to a signal oclk, which can also increment Out_Ptr.

An output register 416 can store data from read FIFO 404 for output from a memory device 400. In the very particular embodiment shown, an output register 416 can be a D-Q type register with a D input connected to receive read data (data'), a clock input that receives clock signal orck and a Q output that provides the read data from output from the memory device.

A clock circuit 412 can receive control clock CK/CK#, and generate latching signals for address register 410 can control circuit 414. In addition, clock circuit 412 can generate orck and clkb from a control clock CK/CK#.

An address register 410 can latch a read address, and apply it to memory array 402 with a timing that is synchronous to a control clock CK/CK#. Similarly, a control circuit 414 can latch command data (CMD) with a timing that is synchronous to a control clock CK/CK#. Command data can indicate a read operation. In the embodiment shown, control circuit 414 can activate a read pulse signal (rps) in response to a read operation, which can be provided as an input to read control circuit 408.

Read control circuit 408 can generate signal oclk in response to rps and clock signals clkb and orck. Signal oclk can be activated with a predetermined latency (in terms of clock cycles) with respect to the application of the read command. Such a latency can be established according to a latency value LAT. A latency value LAT can be set (i.e., hardwired) or can be programmable.

Figure 4B:
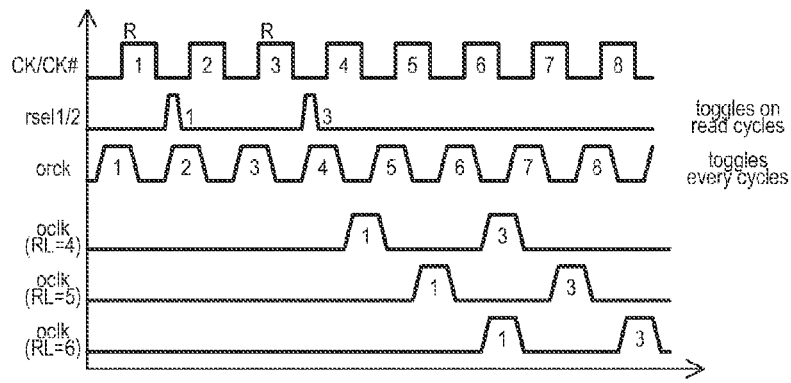
FIG. 4B is a timing diagram showing read operations for a memory device like that of FIG. 4A.
Figure 5:
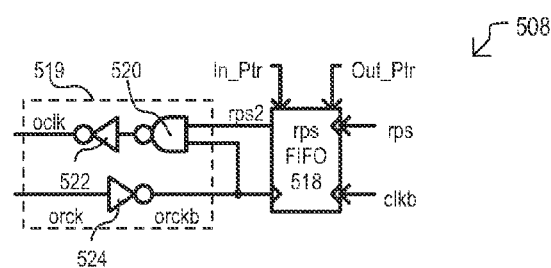

FIG. 4B is a timing diagram showing read operations for the memory device 400 of FIG. 4A. FIG. 4B includes waveforms for CK/CK#, rsel1/2 (i.e., the signal that clocks read data into the FIFO 404), and orck. In addition, FIG. 4B also shows three different examples of oclk (the signal that clocks read data out of FIFO 404) for four different latency values RL=4, 5 and 6). Such operations are understood from the description of the embodiments above.

FIG. 5 shows a read control circuit 508 according to one particular embodiment. A read control circuit 508 can include a read control FIFO 518 and output timing logic 519. A read control FIFO 518 can store a read pulse signal (rps) at an input pointer In_Ptr location according to clock signal clkb. An input pointer value In_Ptr can be incremented by signal clkb, which can be a periodic clock signal. Thus, if rps is active, clkb will clock in an active value at the In_Ptr storage location. In contrast, if rps is inactive, an inactive value will be stored at the In_Ptr storage location.

A read control FIFO 518 can output stored rps value at an output pointer Out_Ptr location according to clock signal orckb as the signal rps2. An output pointer value Out_Ptr can be incremented by signal orckb, which can also be a periodic clock signal.

From the above, it is understood that a latency between the stored value rps and output value rps2 can be established by a difference between the In_Ptr and Out_Ptr values. Further, such a latency is easily changed, by changing either (or both) pointer values. This is in sharp contrast to conventional approaches which re-design timing circuits and/or read data paths to accommodate a different latency.

Output timing logic 519 can ensure a final FIFO output clock signal oclk is timed according to orckb. In the very particular embodiment shown, output timing logic can include an inverter 524 that inverts orck to generate orckb, a NAND gate 520 which receives orckb and rsel2 as inputs and has an output that drives inverter 522. Inverter 522, and the output of NAND gate 520, provides signal oclk.

It is understood that FIG. 5 shows a read control circuit according to but one very particular embodiment.

While embodiments can include memory devices with read path latency circuits, embodiments can also include memory devices with write path latency circuits. Such embodiments will now be described.

Figure 6A:
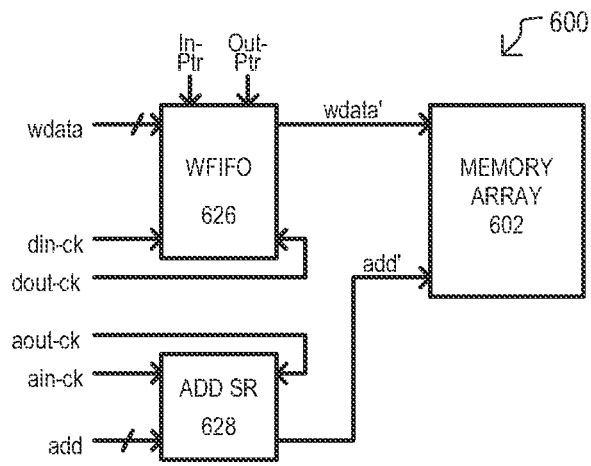
FIG. 6A is a block schematic diagram of a memory device that can establish a write data latency, according to one embodiment.

Referring now to FIG. 6A, a memory device according to an embodiment is shown in a block schematic diagram and designated by the general reference character 600. A memory device 600 can include a memory array section 602, a write FIFO 626, and an address shift-register (S-R) circuit 628. A memory array section 602 can include features like those described for memory array 102 of FIG. 1. In FIG. 6A, in response to a write address value (add') and write data (wdata'), a memory array 602 can store the write data.

A write FIFO 626 can provide write data to a memory array 602 in a first-in-first-out fashion, according to an input pointer (In_Ptr) and output pointer (Out_Ptr). Write data can be clocked into write FIFO 626 according to a data-in signal (din-ck), and write data can be clocked out of the write FIFO 626 according to a data-out signal (dout-ck). Both signals din-ck and dout-ck can be activated in response to write operations. Like read FIFOs described herein, received write data is stored at a FIFO address location indicated by In_Ptr and output from a FIFO address location indicated by Out_Ptr. Pointer In_Ptr can be incremented in response to din-ck, and pointer Out_Ptr can be incremented in response to dout-ck.

An address S-R circuit 626 can provide a write address to memory array 602, also in a first-in-first-out fashion. However, in the particular embodiment shown, addresses are not stored by way of pointers, but can be serially loaded into, and output from, the S-R circuit 626 in response to write operations. It is understood that while some address S-R circuits can include a serial connection of registers, in other embodiments, S-R circuits can be realized with other memory structures, including but not limited to look-up tables, and memory arrays with logical to physical address re-mapping, including but not limited to random access memories (RAMs) and content addressable memories (CAMs).

Referring still to FIG. 6A, in a write operation, a write address (add) can be applied to address S-R circuit 626. In a particular embodiment, the write address (add) and corresponding write command can be phase aligned with a timing clock for the memory device 600. As write operations occur, write addresses (add) can be clocked through the S-R circuit 626. The number of write operations before a write address is applied to a memory can be conceptualized as an address S-R depth. In particular embodiments, an S-R depth can be the number of stages in an address S-R circuit 626. Accordingly, a depth of an address S-R circuit 626 can be adjusted to correspond to a desired write latency.

At a different time, or the same time, write data (wdata) can be applied to write FIFO 626. In some embodiments, such data can also be phase aligned with a timing clock. Write FIFO 626 can store write data (wdata) at a location indicated by "In_Ptr" in response to signal din-ck. Signal din-ck can be generated in response to a write command and can vary according to a desired latency (i.e., can establish a write latency), and can increment In_Ptr. Write FIFO 626 can output data from a location indicated by "Out_Ptr" in response to signal dout-ck, which can also increment Out_Ptr. Signal dout-ck can be generated in response to a write command, but in some embodiments, can be independent of any write latency.

Accordingly, a write latency (difference between application of a write command/address and application of corresponding write data) can be established according to the latency of write FIFO 626 and the depth of an address S-R circuit 628.

Figure 6B:
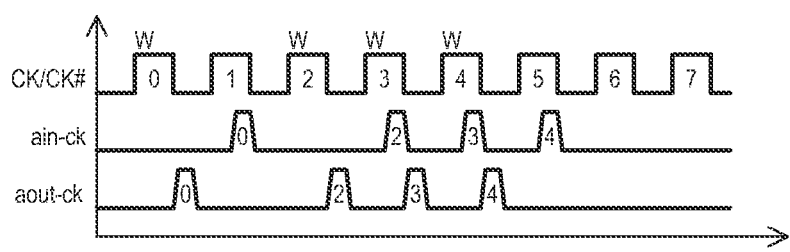
FIGS. 6B and 6C are timing diagrams showing write operations for the memory device like that of FIG. 6A.

FIG. 6B is a timing diagram showing the operation of an address S-R circuit, like that shown as 628 in FIG. 6A, according to one particular embodiment. FIG. 6B includes the waveforms: CK/CK#, which can be a system clock; ain-ck, which can clock addresses into an address S-R circuit; and aout-ck, which can clock addresses out of the address S-R circuit.

In the very particular embodiment of FIG. 6B, a "W" above rising edges of CK/CK# shows the application of a write operation. In response to a write operation, aout-ck can be activated (go high in this example) to clock a value (which may be invalid data, or a previously stored address) out of the S-R circuit. Thus, in response to write operations as cycles 0, 2, 3, and 4, aout-ck pulses 0, 2, 3 and 4 can be generated. As noted above, in some embodiments, addresses will be clocked out at a predetermined depth of S-R circuit. In particular embodiments, aout-ck can be activated independent of any write latency.

Also in response to a write operation, ain-ck can be activated. In some embodiments, ain-ck is also activated independent of any write latency (with the depth of the address S-R circuit establishing the latency). In the particular embodiment of FIG. 6B, ain-ck can be activated some delay after the application of an address, to enable processing of address values (e.g., parity check). Thus, in response to write operations as cycles 0, 2, 3, and 4, ain-ck pulses 0, 2, 3 and 4 can be generated.

Figure 6C:
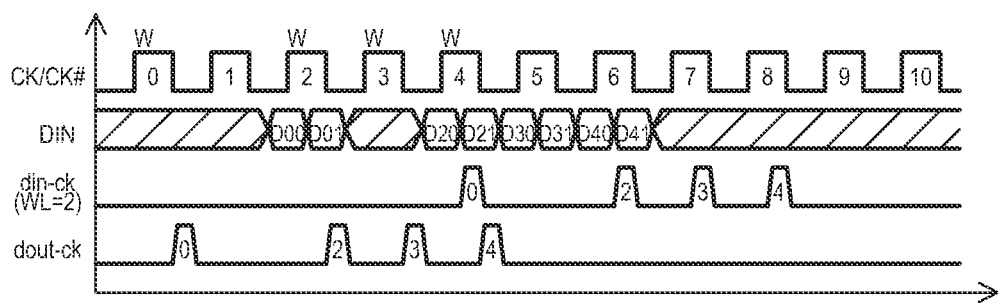

FIG. 6C is a timing diagram showing the operation of a write FIFO, like that shown as 626 in FIG. 6A, according to one particular embodiment. FIG. 6C includes the waveforms: CK/CK#, which can be a system clock; DIN, which shows the application of write data to a memory device; din-ck, which can clock write data into a write FIFO; and dout-ck, which can clock write data out of the write FIFO. In the embodiment of FIG. 6C, operations occur with a write latency of two cycles (WL=2).

As in the case of FIG. 6B, in the very particular embodiment of FIG. 6C, a "W" above rising edges of CK/CK# shows the application of a write operation.

Corresponding to a write latency of two, write data can be applied two cycles following the corresponding write command. In the very particular embodiment shown, write data can be applied at a double-data-rate. Thus, data values D00/D01 can be applied two cycles after the write operation at cycle 0, data values D21/D21 can be applied two cycles after the write operation at cycle 2, etc.

In response to each write operation, dout-ck can be activated (go high in this example) to clock a previously stored write data values (or invalid values) out of the write FIFO. In particular embodiments, dout-ck can be activated independent of any write latency.

Also in response to a write operation, din-ck can be activated. In some embodiments, din-ck can be activated according to a desired write latency. Further, activation of din-ck can vary according to any pre-processing of write data (e.g., alignment, error correction code generation). In the particular embodiment shown, in response to the write command at cycle 0, din-clk can be activated at about cycle 4, to store data values D00/D01 in a write FIFO.

Figure 7A:
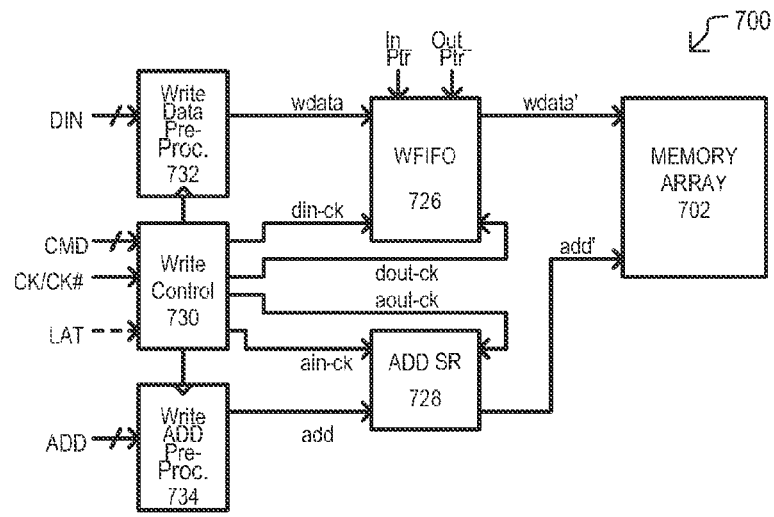
FIG. 7A is a block schematic diagram of a memory device that can establish a write data latency, according to another embodiment.

Referring now to FIG. 7A, a memory device 700 according to another embodiment is shown in block schematic diagram. Memory device 700 can have sections like those of FIG. 6A, and such like sections can have the same or equivalent structures.

FIG. 7A differs from FIG. 6A in that it also shows a write control circuit 730, a write data pre-processing section 732, and a write address pre-processing circuit 734. A write control circuit 730 can generate control signals for clocking write data into and out of write FIFO 726 (din-ck, dout-ck). A write control circuit 730 can receive command inputs (CMD) and one or more clock signals CK/CK#, and can determine when write commands are received. In response to write commands, write control circuit 730 can activate dout-ck followed by din-ck. As noted in above, signal dout-ck can be independent of any latency value, clocking out write data with each new received write command. In contrast, activation of din-ck can vary according to a latency value (represented by LAT). A latency value (LAT) can be set by a design (e.g., not changeable) or can be a value that is programmable. Also in response to write commands, write control circuit 730 can activate aout-ck followed by ain-ck. As noted above, in some embodiments, both aout-ck and ain-ck can be independent of any latency value.

Write data pre-processing circuit 732 can perform predetermined functions on write data as they are received. Write control circuit 730 can activate din-ck a sufficient time after receipt of a write command to ensure data have been processed through data pre-processing circuit 732. In some embodiments, write data pre-processing circuit 732 be synchronous, clocking/operating on write data according to a signal synchronous with CK/CK#. However, in alternate embodiments, all or a portion of write data pre-processing circuit 732 can be self-timed, operating independently of any synchronous timing signal. In very particular embodiments, write data pre-processing circuit 732 can include any of: data aligning circuits, error code generation circuits, error detection/correction circuits, data encryption or decryption circuits, or data scrambling/de-scrambling circuits, data inversion/non-inversion circuits, as a but a few examples.

Like write data pre-processing circuit 732, write address data pre-processing circuit 734 can perform predetermined functions on address values as they are received. In some embodiments, write address pre-processing circuit 734 be synchronous, clocking/operating on address values according to a signal synchronous with CK/CK#. However, in alternate embodiments, all or a portion of write address pre-processing circuit 734 can be self-timed, operating independently of any synchronous timing signal. In very particular embodiments, write address pre-processing circuit 734 can include any of: error detection/correction circuits (e.g., parity check circuits), address encryption or decryption circuits, or address scrambling/de-scrambling circuits, address inversion/non-inversion circuits, as a but a few examples.

Figure 7B:
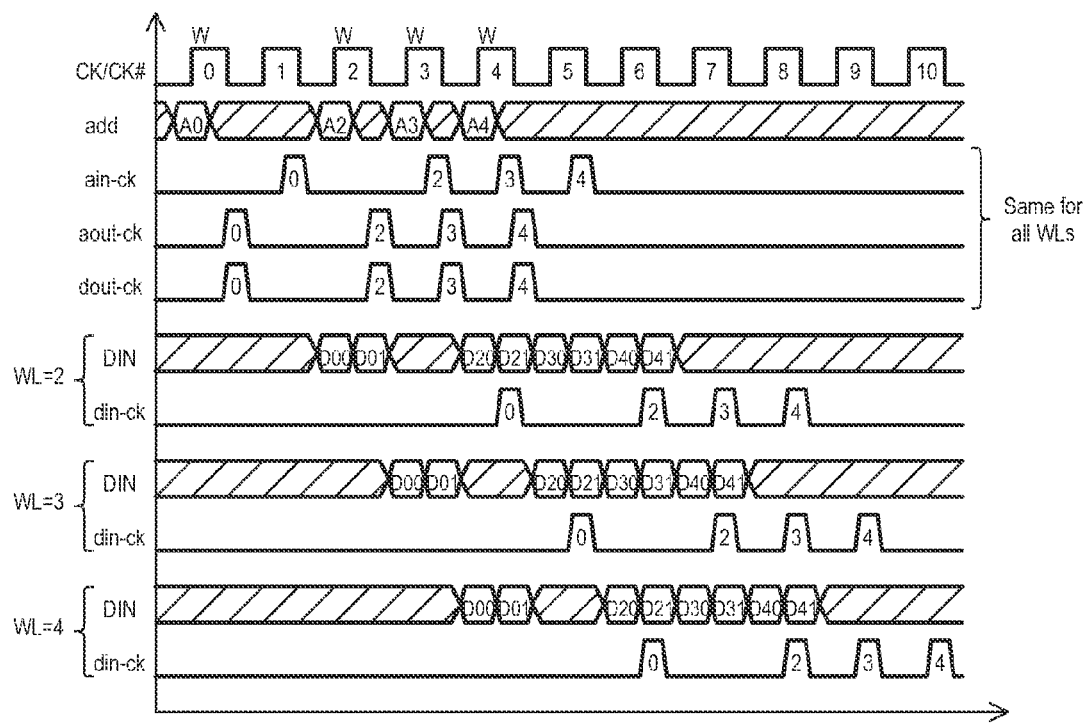
FIG. 7B is a timing diagram showing various write operations for a memory device like that of FIG. 7A.

FIG. 7B is a timing diagram showing write operations for a memory device like that of FIG. 7A, according to particular embodiments. FIG. 7B shows the following waveforms: CK/CK#, which can be a system clock; add, which can be an applied write address; ain-ck, which can clock addresses into an address S-R circuit; aout-ck, which can clock addresses out of the address S-R circuit; and dout-ck, which can clock data out of a data FIFO.

In addition, FIG. 7B shows three examples of DIN/din-ck for three different write latency values (WL=2, 3, 4). DIN can be data applied at an input of the memory device. Waveform din-ck can clock data out of a write FIFO.

In FIG. 7B, write commands and corresponding addresses (A0, A2, A3 and A4) can be applied at clock cycles 0, 2, 3 and 4. In response to such write commands, signals ain-ck, aout-ck and dout-ck can be activated. It is noted that the activation of such signals can be the same, regardless of a write latency (WL).

In the very particular embodiment shown, din-ck can be activated about two cycles following receipt of the write data, to allow for pre-processing of write data. Alternate embodiments can activate a signal din-ck sooner or later than the application of the corresponding write data.

Figure 8A:
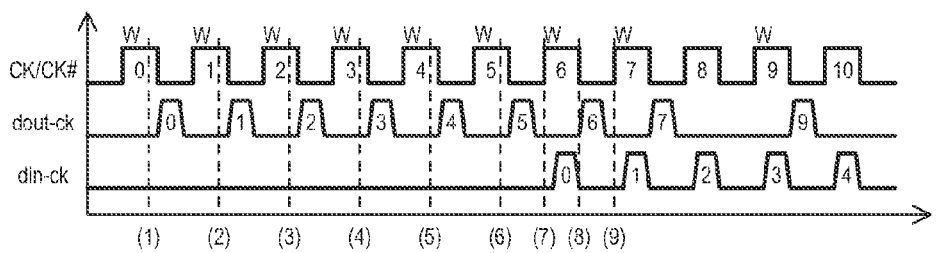
FIG. 8A is a timing diagram showing write operations according to an embodiment.

FIG. 8A is a timing diagram showing write operations of a write FIFO according to embodiments. FIG. 8A shows a number of waveforms: CK/CK# is a periodic system clock (or its complement); dout-ck shows a signal that can transfer data out of a write FIFO and increment an output pointer (Out_Ptr); and din-ck shows a signal that can transfer data into a write FIFO and increment an input pointer (In_Ptr).

Figures 0, 8B:
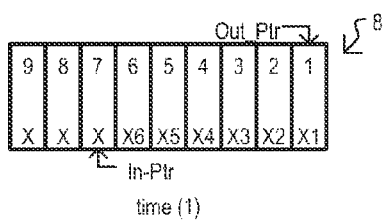
Figures 1, 8B:
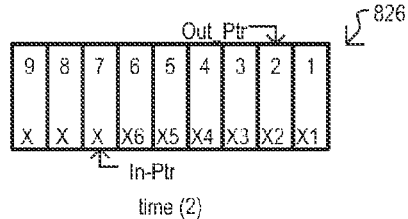
Figures 2, 8B:
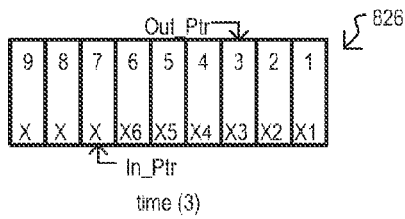
Figures 3, 8B:
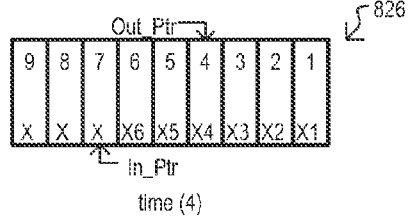
Figures 4, 8B:
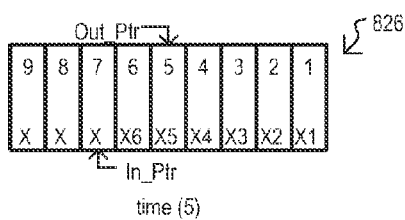
Figures 5, 8B:
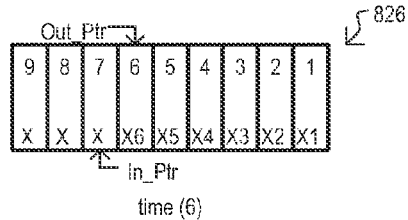
Figures 6, 8B:
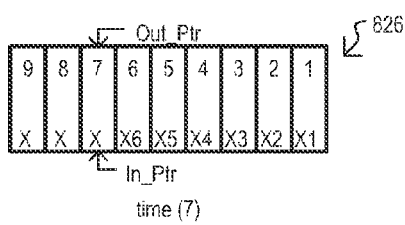
Figures 7, 8B:
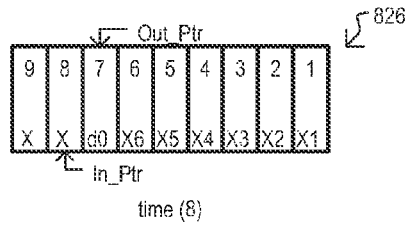
Figures 8, 8B:
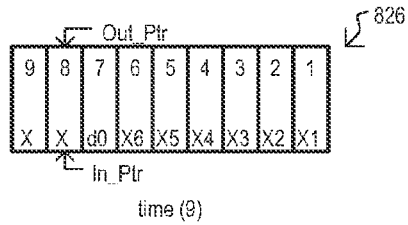

FIGS. 8B-0 to 8B-8 are block diagrams showing one example of a write FIFO 826 at various times during the write operations of FIG. 8A. In the figures shown, write FIFO 826 has nine storage locations (labeled 1-9). Input and output pointer locations are shown "In-Ptr" and "Out-Ptr" and corresponding arrows.

FIG. 8B-0 shows a write FIFO 826 at time (1). In_Ptr and Out_Ptr are at initial locations, with In_Ptr pointing to location 7 and Out_Ptr pointing to location 1. All storage locations store invalid values, indicated by "X" and X1 to X6.

FIG. 8B-1 shows a write FIFO 826 at time (2). In response to an active dout-ck signal, a (invalid) data value X1 can be clocked out of the write FIFO and the pointer Out_Ptr can advance to position 2.

FIGS. 8B-2, -3, -4, -5 and -6, show a write FIFO 826 at times (3), (4), (5), (6) and (7), respectively. In response to the active dout-ck signals, data values X2, X3, X4, X5 and X6 can be clocked out of the write FIFO and the pointer Out_Ptr can be advanced one position each time.

FIG. 8B-7 shows write FIFO 826 at time (8). In response to an active din-ck signal, write data value d0 (corresponding to the first write operation at cycle 0) can be stored at location 7, and the input pointer In_Ptr can be advanced to position 8. In some embodiments, write data d0 can represent a write data value that has been pre-processed (data aligned, error correction codes generated), while in other embodiments a data value d0 can be a data value as latched.

FIG. 8B-8 shows a write FIFO 826 at time (9). In response to an active dout-ck signal, valid data value d0 can be clocked out of the write FIFO for storage in a memory cell array and the pointer Out_Ptr can advance to position 8.

As understood from above, the delay at which din-ck is activated with respect to a corresponding write command can vary according to a desired latency and/or write data pre-processing (if any).

Figure 9A:
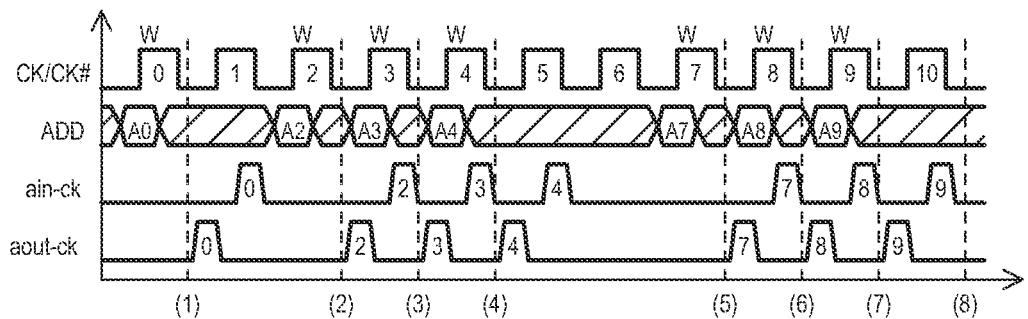
FIG. 9A is a timing diagram showing write operations according to additional embodiments.

FIG. 9A is a timing diagram showing write operations of an address S-R circuit according to embodiments. FIG. 9A shows a number of waveforms: CK/CK# is a periodic system clock (or its complement); ADD shows address values applied with write commands; ain-ck shows a signal that can transfer data into an address S-R circuit; and aout-ck shows a signal that can transfer data out of an address S-R circuit.

Figures 0, 1, 9B:
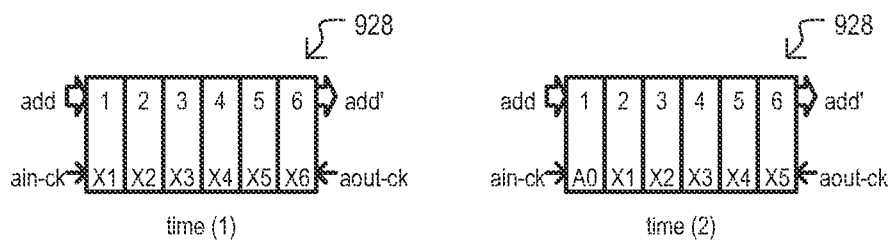
Figures 2, 3, 9B:
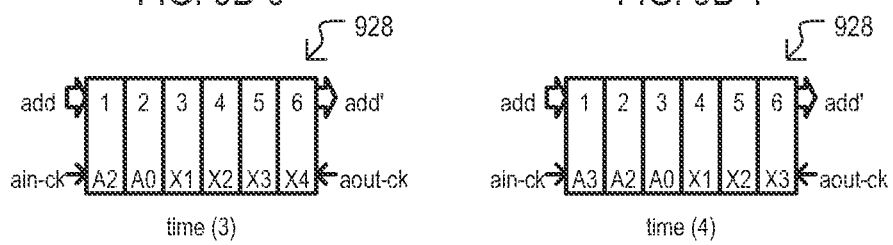
Figures 4, 5, 9B:
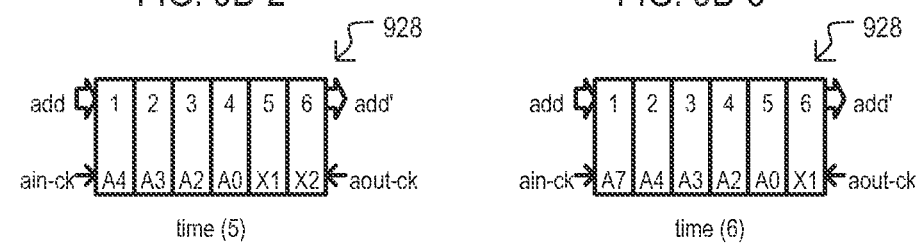
Figures 6, 7, 9B:
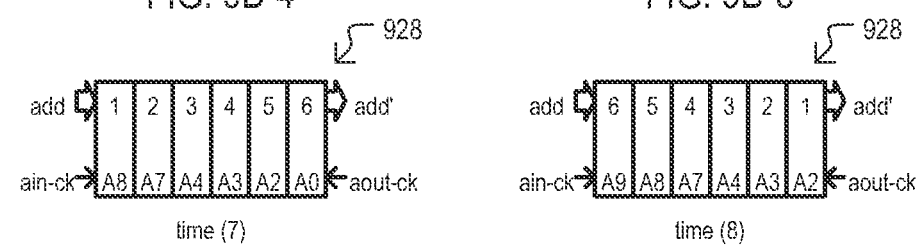

FIGS. 9B-0 to 9B-7 are block diagrams showing one example of an address S-R circuit 928 at various times during the write operations of FIG. 9A. In the figures shown, write FIFO 928 has six storage locations (labeled 1-6).

FIG. 9B-0 shows an address S-R circuit 928 at time (1). S-R circuit 928 can store invalid values, shown as X1 to X6.

FIG. 9B-1 shows an address S-R circuit 928 at time (2). Following an active aout-ck signal, invalid address value X6 can be output from the S-R circuit 928. Further, following an active ain-ck signal, all stored values can advance from one location to the next address, and address A0 (received at cycle 0) can be stored at first location 1.

FIG. 9B-2 shows an address S-R circuit 928 at time (3). Following an active aout-ck signal, invalid address value X5 can be output from the S-R circuit 928. Further, following an active ain-ck signal, all stored values can advance from one location to the next, and address A2 (received at cycle 2) can be stored at first location 1.

From the above it is understood that address values propagate into and out of the address S-R circuit 928 in response to signals ain-ck and aout-ck which correspond to write addresses/commands. That is, such addresses do not advance through an S-R circuit with each cycle of a clock, but rather according to the receipt of write addresses.

FIG. 9B-3 shows an address S-R circuit 928 at time (4). With active aout-ck and ain-ck signals, invalid address value X4 can be output from the S-R circuit 928, storage values advanced in position, and address A3 can be stored at first location 1.

FIG. 9B-4 shows an address S-R circuit 928 at time (5). With active aout-ck and ain-ck signals, invalid address value X3 can be output from the S-R circuit 928, storage values advanced in position, and address A4 can be stored at first location 1. Because no write operations are received for cycles 5 and 6 of CK/CK#, addresses do not advance through the S-R circuit 928.

FIGS. 9B-5, -6 and -7 shows an address S-R circuit 928 at times (6), (7) and (8), respectively. With the activation of aout-ck and ain-ck signals, invalid addresses continue to advance through S-R circuit 928. As shown in FIG. 9B-7, in response to the active ain-ck and aout-ck signals corresponding to cycle 9, address A0 is shifted out of the S-R circuit 928.

As noted above, and as will be explained in more detail below, a latency provided by address S-R circuit 928 can vary according to a depth at which a value is read from the S-R circuit. As but one example, for one latency value, an address can be read from location 4. For a next higher latency value, an address can be read from location 5, etc.

Figure 10A:
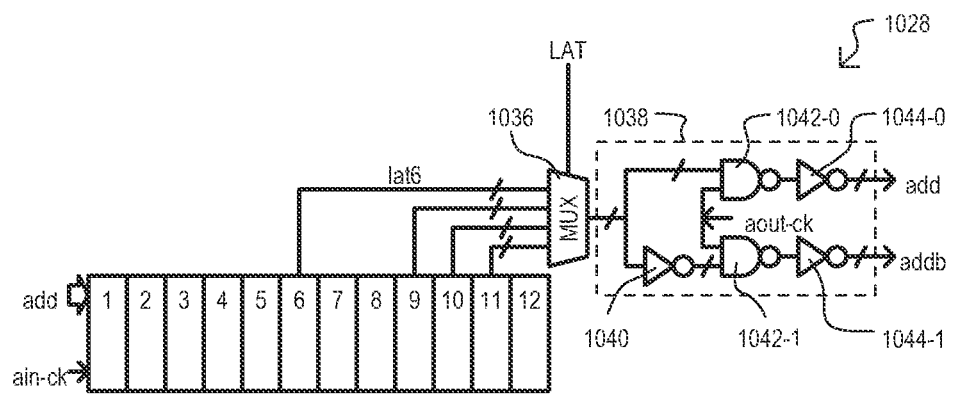
FIG. 10A is a block schematic diagram of an address S-R circuit according to one embodiment.

FIG. 10A is a block schematic diagram of an address S-R circuit 1028 that can be included in embodiments. S-R circuit 1028 can include storage locations (shown as 1 to 12), a latency selection multiplexer (MUX) 1036 and output timing logic 1038. Storage locations (1-12) can operate as described above, advancing stored address values and storing new addresses in location 1.

Latency selection MUX 1036 can have different inputs connected to different storage locations, with such different storage locations (i.e., depths) corresponding to a desired latency. By selecting an appropriate storage location (depth), a write address can be output at a desired timing with respect to its corresponding write data. In the very particular embodiment shown, MUX 1036 has a first input, corresponding to a latency of 6, connected to storage location 6, a second input for a latency of 9, connected to storage location 9, a third input for a latency of 10, connected to storage location 10, and a third input for a latency of 11, connected to storage location 11. One of the inputs of MUX 1036 can be established as the output of MUX 1036 according to a latency value LAT.

Output timing logic 1038 can output an address from a selected depth of the S-R location (i.e., depth) in response to signal aout-ck. In the very particular embodiment of FIG. 10A, output timing logic 1038 can provide an address (add) and inverted address (addb), and can include an inverter 1040, NAND gates 1042-0/1 and inverters 1044-0/1. In operation, an address can be applied in non-inverted form to NAND gate 1042-0, while inverter 1040 can invert such an address and provide it to NAND gate 1042-1. In response to an active aout-ck signal, NAND gates 1042-0/1 can output their received address values.

Figure 10B:
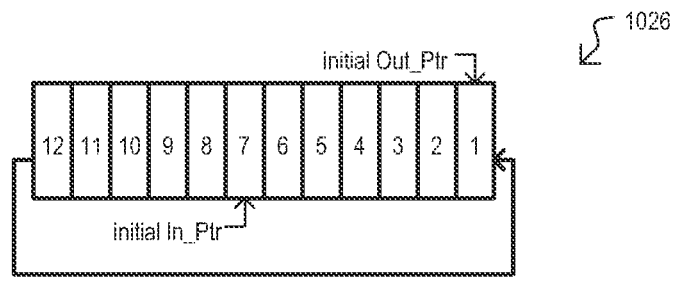
FIG. 10B is a block schematic diagram of a write FIFO corresponding to the S-R circuit of FIG. 10A.

FIG. 10B is a block schematic diagram of a write FIFO 1026 corresponding to that of FIG. 10A. Write FIFO 1026 can include 12 storage location (shown as 1 to 12), an input pointer In_Ptr, and an output pointer Out_Ptr. FIG. 10B shows initial positions of pointers In_Ptr and Out_Ptr. In the embodiments of FIGS. 10A/B, in general, if a depth of an address S-R is m, an initial position of In_Ptr=Out_Ptr+m. Accordingly, FIG. 10B shows a write FIFO configured to accommodate a latency of 6, as Out_Ptr=1 and In_Ptr=7.

Figure 11A:
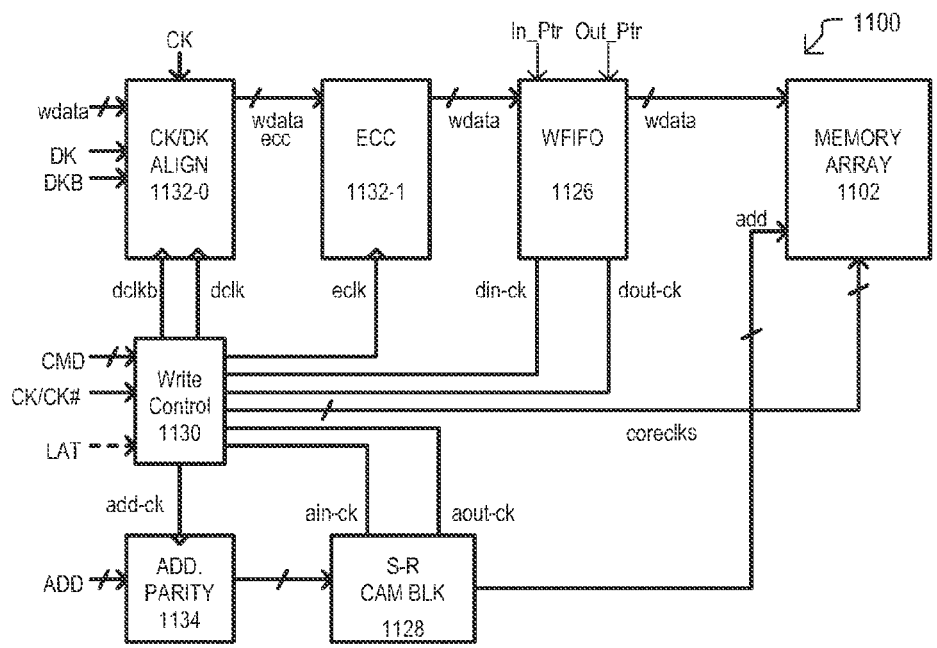
FIG. 11A is a block schematic diagram of a memory device that can establish a write latency according to another embodiment.

Referring to FIG. 11A, a memory device 1100 according to a further embodiment is shown in a block diagram. Memory device 1100 can include sections like those of FIG. 7A. Such like sections can have a same or an equivalent structure and operation like those of FIG. 7A.

FIG. 11A shows a write data path having a data alignment section 1132-0 and an error correction code generation (ECC) section 1132-1, in series before the write data FIFO 1126. A data alignment section 1132-0 can latch data values, at a double data rate, on rising edges of a clock DK and its complement DKB. Such data values can be aligned with one another to form one parallel write data value. In the particular embodiment shown, data alignment section 1132-0 can operate synchronous to a system clock CK/CK#. ECC section 1132-1 can generate error correction codes on received write data values. In the embodiment shown, ECC section 1132-1 can also operate in synchronism with CK/CK#.

FIG. 11A also shows a write address path that includes a parity check section 1134 and a S-R CAM block 1128. A parity check section 1134 can perform a parity check on received address values, using one or more parity bits, to determine if any address value has an error. An S-R CAM block 1128 can include a content addressable memory (CAM) structure that is configurable to operate as a shift-register, as described herein, or an equivalent. S-R CAM block 1128 can receive addresses from parity check section 1134 and output them to memory array 1102 according to signals ain-ck and aout-ck, as described herein, or an equivalent. An S-R CAM block 1128 can ensure that read operations to addresses that have yet to receive write data (i.e., write data is still propagating through a write FIFO) output the most recent data values. In particular, a S-R CAM block 1128 can compare an incoming read address to stored write addresses (corresponding to data that have yet to be written into the memory array 1102), and if a match is generated, the appropriate write data is output as read data.

In addition to providing timing signals to the various other sections, write control circuit 1130 can generate control signals coreclks that can control timing for other operations within memory array 1102.

Figure 11B:
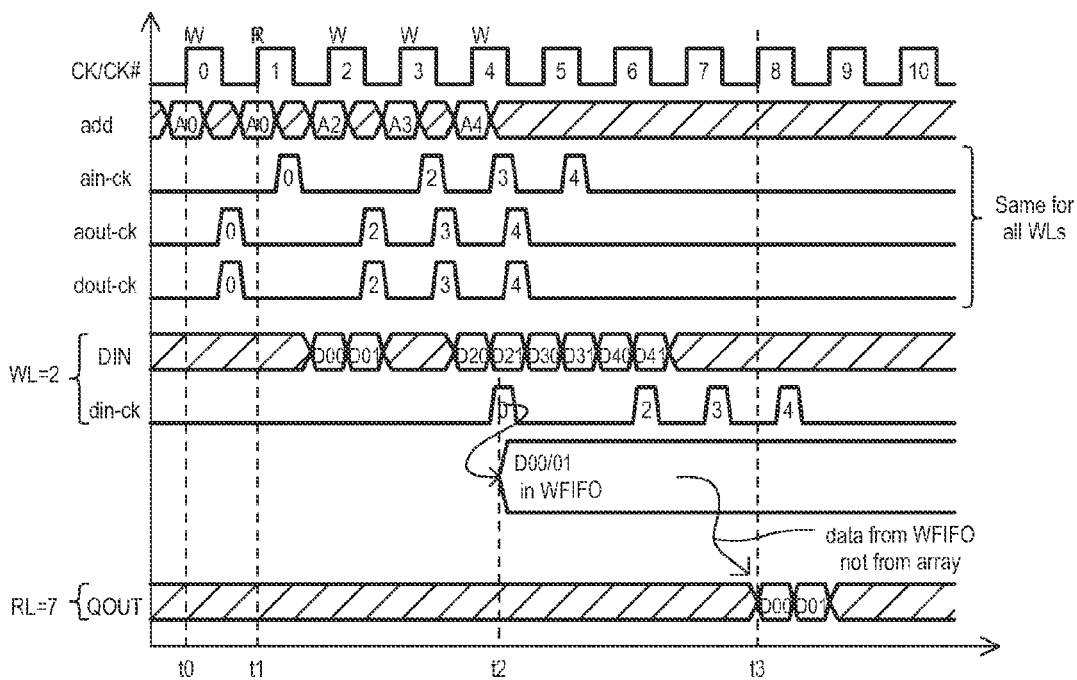
FIG. 11B is a timing diagram showing operations of a memory device like that of FIG. 11A.

FIG. 11B is a timing diagram showing the operation of an S-R CAM block 1128 according to one embodiment. At time t0, a write command can be received to write data value D00/01 to address "A0". Such a data value can be latched within a write FIFO and the write address can be stored in an S-R CAM block, as described herein, or an equivalent.

At time t1, a read command can be received, also directed to address "A0". That is, a read command is issued to a location that has yet to be updated with new write data. A S-R CAM block 1128 can compare incoming read addresses to write addresses propagating through the S-R CAM block 1128. Because the circuit has a CAM structure, such an address comparison can be substantially simultaneous (i.e., a read address is compared to all stored write addresses simultaneously)

At time t2, in response to signal d-in being activated, the write data D00/01 can be stored in a write FIFO.

At time t3, the write data D00/01 can be output as read data, but not from a memory array (as such data is outdated). Instead, the data D00/01 can be output from the write data path. In the embodiment shown, such data can be output from a write FIFO.

Figure 12:
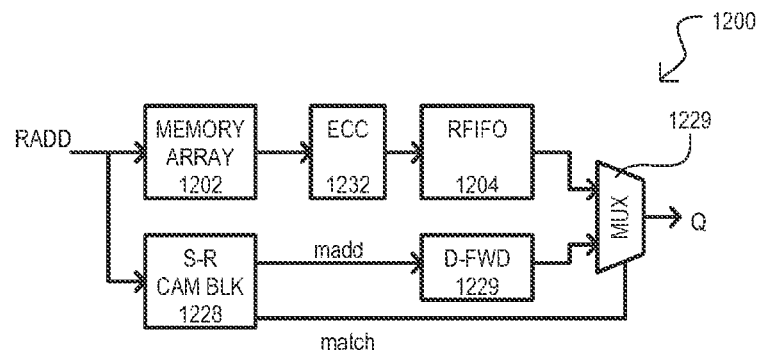
FIG. 12 is a block schematic diagram of S-R content addressable memory (CAM) block that can be included in embodiments.

Referring now to FIG. 12, the operation of a memory device 1200 having a CAM S-R block 1228 according to one embodiment will be described.

In response to a read command, a read address (RADD) can be applied to a memory cell array 1202 and read operations can proceed through a read path. In the embodiment shown, read data can be error corrected in an ECC block 1232 and then stored in a read FIFO 1204, as described herein, or an equivalent.

In addition, the read address (RADD) can also be applied to S-R CAM block 1228, where it can be compared to stored write addresses (i.e., addresses that are propagating through the S-R CAM block 1228). If a read address matches a stored write address, the matching address (madd) can be forwarded to a data forwarding circuit 1229 and a match indication (match) can be activated. A data forwarding circuit 1229 can store write data, accessible by the value (madd), that has yet to be written into memory array 1202. A match indication (match), can control a data MUX 1229.

Accordingly, if a read address does not match a write address stored in S-R CAM block 1228, a read data value from read FIFO 1204 can be output via data MUX 1229. However, if a read address matches a write address stored in S-R CAM block 1228, a write data value, stored in data forwarding circuit 1229, can be output via data MUX 1229.

Figure 13:
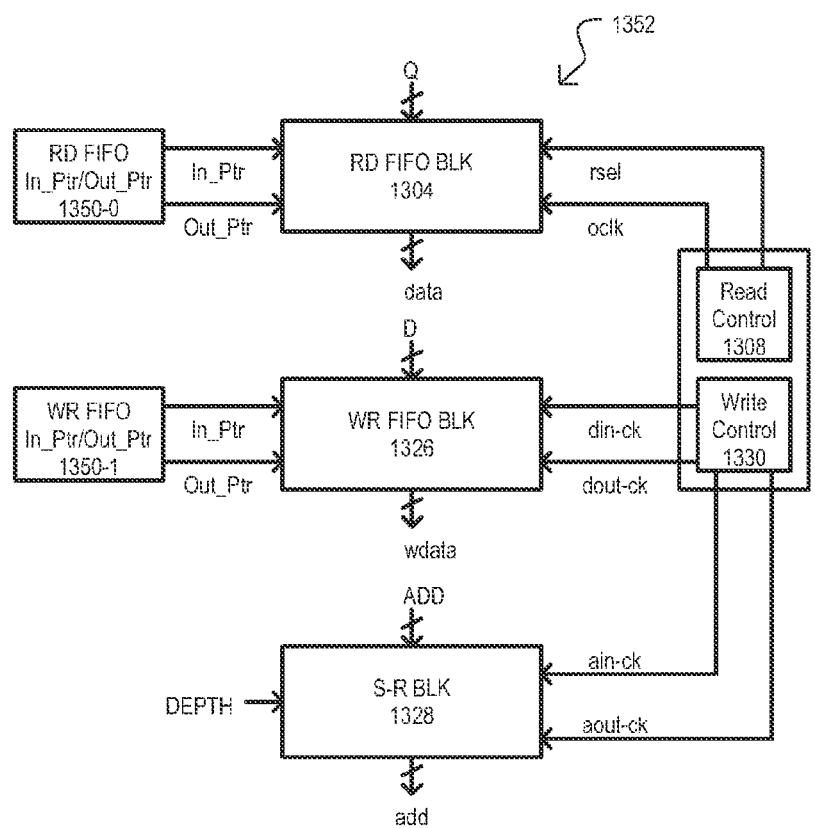
FIG. 13 is a block diagram of a latency control section according to an embodiment.

Referring to FIG. 13, a latency control circuit 1352 for a memory device, according to one embodiment, is shown in a block schematic diagram. A latency control circuit 1352 can include a read FIFO block 1304, a write FIFO block 1326, an S-R block 1328, pointer circuits 1350-0/1, and control circuits 1308/1330. A read FIFO block 1304 can include one or more read FIFOs as described herein, or equivalents. A read FIFO block 1304 can introduce latencies into read data output from a memory array based on input and output pointer values provided by pointer circuit 1350-0, where such pointer values can be advanced by control signals rsel and oclk.

A write FIFO block 1326 can include one or more write FIFOs as described herein, or equivalents. A write FIFO block 1326 can introduce latencies into write data applied to a memory array based on input and output pointer values provided by pointer circuit 1350-1, where such pointer values can be advanced by control signals din-ck and dout-ck.

S-R block 1328 can include one or more address S-R circuits as described herein, or equivalents. An S-R block 1328 can introduce latencies into address values applied to a memory array based on an established depth (DEPTH) of the S-R block 1328. Address values can be clocked into and out of the S-R block by control signals ain-ck and aout-ck.

Control circuits 1308/1330 can establish the various latency control values provided to any of blocks 1304, 1326 or 1328 according to the activation of timing signals as described herein, or equivalents. As but a few examples, signals rsel and oclk can be generated in response to a read command, with rsel being independent of any timing clock. Similarly, din-ck, dout-ck, ain-ck and aout-ck can be generated in response to write commands. Latency values can be set within control circuits 1308/1330 in any of various ways. As but a few of the many possible examples, such values can be established by manufacturing steps (e.g., fabrication mask options, laser fusible links, packaging options) or electronically programmed (e.g., electrically fusible links, one time programmable elements, nonvolatile memory cells, volatile memory cells). In the latter case, control of latency values can be static or dynamic (i.e., changed on the fly).

Figure 14:
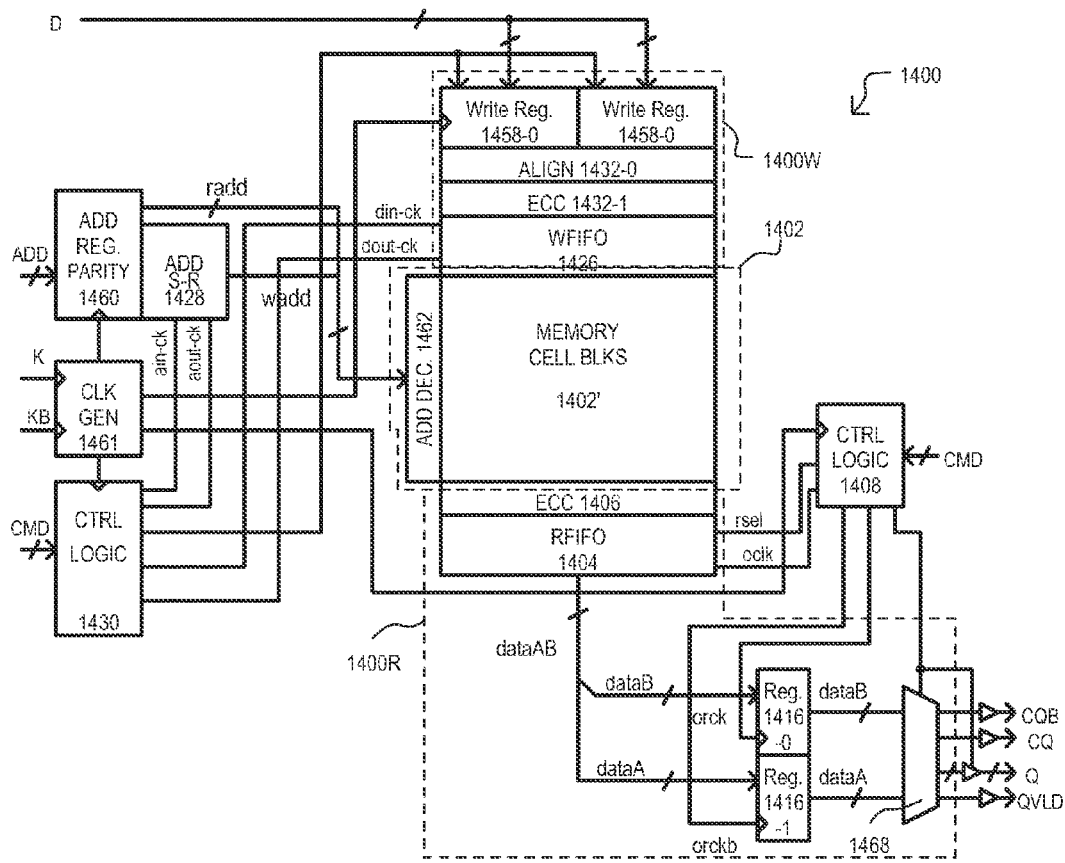
FIG. 14 is a block schematic diagram of a quadruple data rate (QDR) memory device according to an embodiment.
Figure 17:
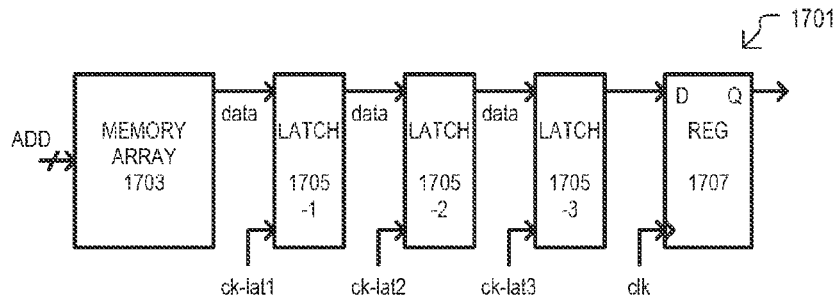
FIG. 17 is a block schematic diagram of a conventional synchronous memory read data path.
Figure 18:
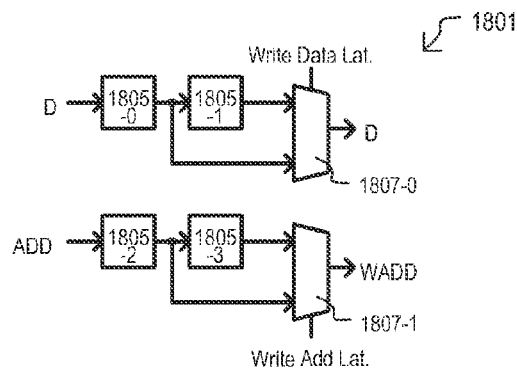
FIG. 18 is a block schematic diagram of a conventional synchronous memory write path.

Referring to FIG. 14, a quadruple data rate (QDR) memory device 1400 according to an embodiment is shown in a block schematic diagram. Memory device 1400 can include a memory array 1402, a write data path 1400W, a read data path 1400R, an address register 1460, address S-R circuit 1428, a clock generator circuit 1461, and control logic 1430.

A memory array 1402 can include memory cell blocks 1402', and address decoder 1462. Memory cell blocks 1402' can include memory cells for storing data values, and in a very particular embodiment, can be SRAM cells. Address decoder 1462 can decode read and write addresses to access storage locations for read and write data (Q and D). In a particular embodiment, memory array 1402 can be a dual port array, enabling simultaneous read and write accesses.

A write data path 1400W can include write registers 1458-0/1, a data alignment circuit 1432-0, ECC circuit 1432-1, and a write FIFO 1426. Write registers 1458-0/1 can latch input data (D) at a double data rate. Data alignment circuit 1432-0 can align data values of different phases with a system clock. ECC circuit 1432-1 can perform error code generation from write data (D). A write FIFO 1426 can introduce a latency into write data as described in the embodiments herein, or equivalents. In some embodiments, such a write data latency can be fixed. In other embodiments, such a write data latency can be programmable.

A read data path 1400R can include an ECC circuit 1406, a read FIFO 1404, registers 1416-0/1, and an output control MUX 1468. ECC circuit 1406 can perform error detection and/or correction on read data (dataAB) output from memory array 1402. A read FIFO 1404 can introduce a latency into read data as described in the embodiments herein, or equivalents. Registers 1416-0 can store one portion of a read data value (dataB), and its values are updated by signal orck. Register 1416-1 can store another portion of the read data value (dataA), and its values are updated by a signal orckb. Signal orck can be synchronous with a timing signal, and in one embodiment, can take the form of that shown in FIG. 4B. Signal orckb can be the inverse of orck. By operation of MUX 1468, different portions of the read data value (Q) can be output at a double data rate.

Address register 1460 can latch an address value (ADD) in a write operation, and provide such a value to address S-R circuit 1428. Address S-R circuit 1428 can take the form of any of the embodiments shown herein, or equivalent, and introduce a latency into address values as they are applied to memory array 1402. A read address register 1464 can latch an address value (ADD) in a read operation, and provide such a value to memory array 1402.

Clock generator circuit 1461 can generate internal clock signals that are synchronous with received complementary input clocks (K, KB). Such internal clock signals can include, but are not limited to, signals for latching address values (ADD), latching data values in a DDR fashion, signals for controlling read and write FIFOs (1426, 1404), and signals for controlling data output latches (1416-0/1).

Control logic 1460/1408 can receive command data and determine when particular operations are to be executed by the memory device 1400, including read and write operations. In response to such commands, control logic can generate control signals din-ck/dout-ck for controlling a write data latency through write FIFO 1426, and control signals rsel/oclk for controlling a read data latency through read FIFO 1404.

By operation of write FIFO 1426, read FIFO 1404 and address S-R circuit 1428, any of various latencies can be established for memory device 1400. Such circuits (1426, 1404, 1428) can be reproduced in memory devices of various types, but be capable of accommodating a wide range of latencies with very little or no modification.

While the above embodiments have shown various devices, circuits and methods, additional methods will now be described with reference to flow diagrams.

FIG. 15 is a flow diagram of a method 1500 according to a first embodiment. A method 1500 can include establishing a latency through a FIFO having input and output pointers (1572). Such an action can include clocking data into and out of FIFO, as described herein or equivalents. A method 1500 can also include transferring data between an array and a device connection via such a FIFO (1574). Such an action can include outputting read data from a memory array to data output connections. In addition or alternatively, such an action can include inputting write data received in data input connections to a memory array.

FIG. 16 is a flow diagram of a method 1600 according to another embodiment. A method 1600 can include establishing a read latency through a read FIFO having input and output read FIFO pointers (1676). A method can also include establishing a write latency through a write FIFO having input and output write FIFO pointers (1678). A method can further include establishing an address latency with an address shift register depth (1680). In very particular embodiments, actions 1676 and 1678 can result in write data and addresses being applied simultaneously to a memory array.

A method 1600 can also include determining a command type (1682). Such an action can include decoding command signals applied to a memory device.

If a read command is received (READ from 1682), a read address can be applied to a memory array (1684). Such an action can result in read data being output from the memory array. A method 1600 can transfer read data from a memory array to a read FIFO via wave pipeline circuits (1686). Such an action can transfer (and/or perform operations on) read data in an asynchronous fashion. In very particular embodiments, such an action can include error detection and/or correction on read data. Read data can be input to a read FIFO according to an input read pointer (1688). Read data can be output from the read FIFO according to an output read pointer (1690). Signals used to clock data into and out of the read FIFO can establish how much latency is introduced by the read FIFO.

Referring still to FIG. 16, if a write command is received (WRITE from 1682), a write address can be transferred to a memory array via a shift-register circuit (1692). Such an action can introduce a latency into an address (with respect to its application to the memory array) corresponding to the depth of the shift-register circuit. A method 1600 can input write data to a write FIFO according to an input write pointer (1694). Write data can be output from the write FIFO to the memory array according to an output write pointer (1670). Signals used to clock data into and out of the write FIFO can establish how much latency is introduced by the write FIFO.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
a data path that includes
a first-in-first-out circuit (FIFO) configured to transfer data between at least one memory cell array and signal connections of the memory device, the FIFO outputting data in response to a FIFO control signal that is synchronous with a periodic clock;
a control circuit configured to activate the FIFO control signal with a predetermined latency in response to an input command; and
a self-timed section, in series with the FIFO, and configured to transfer data independent of the periodic clock.

2. The memory device of claim 1, wherein:
the FIFO comprises a read FIFO configured to couple read data from the at least one memory cell array to a data output in synchronism with the periodic clock, the read FIFO having a read input pointer and a read output pointer of the read FIFO.

3. The memory device of claim 2, further including:
the read FIFO outputs the read data in response to a read control signal that is synchronous with the periodic clock; and
the control circuit is a read control circuit configured to activate the read control signal with a predetermined latency with respect to a read command.

4. The memory device of claim 2, further including:
the self-timed section comprises a wave pipeline circuit coupled between the at least one array and the read FIFO, the wave pipeline circuit configured to operate asynchronously in response to read data from the at least one memory cell array.

5. The memory device of claim 4, wherein:
the wave pipeline circuit comprises an error circuit, the error circuit being selected from the group of: an error detection circuit, an error detection and correction circuit, and an error code generation circuit.

6. The memory device of claim 2, further including:
a data register circuit configured to latch read data output from the read FIFO and comprising
a first data path configured to output a first portion of the read data on rising edges of a read data clock, and
a second data path configured to output a second portion of the read data on falling edges of the read data clock.

7. The memory device of claim 1, further including:
the FIFO comprises a read FIFO configured to couple read data from the at least one memory cell array to a data output;
a write FIFO configured to couple write data from a data input to the at least one memory cell array in synchronism with the periodic clock; and
an address shift-register (S-R) circuit configured to couple write addresses from an address input to the at least one memory cell array through a plurality of stages of the S-R circuit.

8. A memory device, comprising:
at least one memory cell array;
a read first-in-first-out circuit (FIFO) configured to output read data from the at least one memory cell array according to a periodic clock signal;
a write FIFO configured to input write data in response to a FIFO control signal that is synchronous with the periodic clock signal; and
a control circuit configured to activate the FIFO control signal with a predetermined latency with respect to at least a first input command corresponding to the write data.

9. The memory device of claim 8, further including:
the write FIFO includes a write input pointer and a write output pointer; and
an address shift-register (S-R) circuit configured to couple write addresses from an address input to the memory cell array through a plurality of S-R stages according to a S-R signal.

10. The memory device of claim 9, wherein:
the write FIFO inputs write data in response to a write control signal that is synchronous with the periodic clock; and
a write control circuit configured to activate the write control signal with a predetermined latency with respect to a write command corresponding to the write data.

11. The memory device of claim 9, wherein:
the address S-R circuit comprises a content addressable memory (CAM) circuit configured to store addresses in CAM entries, and to generate match indications in response to a received addresses matching a stored address.

12. The memory device of claim 9, wherein:
the address S-R circuit comprises at least one output multiplexer (MUX) having MUX inputs connected to different S-R stages of the S-R circuit, and a MUX output configured to provide address values to the at least one memory cell array.

13. The memory device of claim 12, further including:
the address S-R circuit inputs addresses in response to an address control signal that is synchronous with the periodic clock; and
a write control circuit configured to activate the address control signal with a predetermined latency with respect to write commands corresponding to such addresses.

14. The memory device of claim 8, wherein:
the read FIFO has a read input pointer and a read output pointer.

15. A method, comprising:
establishing a latency of an integrated circuit (IC) device write data path by operation of a write first-in-first-out circuit (FIFO);
transferring write data between at least one memory cell array and connections of the IC device via at least the write FIFO;
establishing a latency of an IC device write address path by operation of a shift-register circuit; and
transferring write addresses in parallel with the write data via the shift-register circuit;
transferring read data through a self-timed circuit from the memory cell array to a read FIFO independently of a periodic clock signal; and
transferring read data through the read FIFO in a synchronism with the periodic clock signal.

16. The method of claim 15, wherein:
establishing a latency of the read data FIFO by reading data out of the read FIFO according to a read control signal having a predetermined latency with respect to a read command corresponding to the read data.

17. The method of claim 15, wherein:
transferring read data through the self-timed circuit includes performing an error detection operation on the read data.

18. The method of claim 15, wherein:
establishing the latency of the write data path includes writing data into the write FIFO according to a write control signal having a predetermined latency with respect to a write command corresponding to the written data, and establishing a latency of the write addresses by applying an address control signal to the shift-register which has a predetermined latency with respect to the write command corresponding to the written data.

\* \* \* \* \*